(12) United States Patent
Jung et al.

(10) Patent No.: US 12,087,344 B2
(45) Date of Patent: Sep. 10, 2024

(54) FERROELECTRIC FET NONVOLATILE SENSE-AMPLIFIER-BASED FLIP-FLOP

(71) Applicant: UIF (University Industry Foundation), Yonsei University, Seoul (KR)

(72) Inventors: Seong Ook Jung, Seoul (KR); Se Keon Kim, Seoul (KR); Tae Woo Oh, Seoul (KR); Se Hee Lim, Seoul (KR); Dong Han Ko, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 316 days.

(21) Appl. No.: 17/804,272

(22) Filed: Jun. 17, 2022

(65) Prior Publication Data
US 2022/0383926 A1     Dec. 1, 2022

(30) Foreign Application Priority Data

May 31, 2021     (KR) .................. 10-2021-0070409

(51) Int. Cl.
*G11C 11/22*     (2006.01)
(52) U.S. Cl.
CPC ...... *G11C 11/2273* (2013.01); *G11C 11/2275* (2013.01); *G11C 11/2297* (2013.01)
(58) Field of Classification Search
CPC ............ G11C 11/2273; G11C 11/2275; G11C 11/2297

USPC ........................................................ 365/145
See application file for complete search history.

(56) References Cited

U.S. PATENT DOCUMENTS

| 6,924,663 B2 | 8/2005 | Masui et al. | |
| 2019/0027213 A1* | 1/2019 | Jung | G11C 11/419 |
| 2023/0377639 A1* | 11/2023 | Jung | G11C 11/419 |

FOREIGN PATENT DOCUMENTS

| JP | 2006-237143 A | 9/2006 |
| JP | 2009-134787 A | 6/2009 |
| KR | 10-0482996 B1 | 4/2005 |
| KR | 10-2154352 B1 | 9/2020 |

OTHER PUBLICATIONS

Non-Final Office Action for KR 10-2021-0070409 by Korean Intellectual Property Office dated Oct. 24, 2022.

* cited by examiner

*Primary Examiner* — Connie C Yoha
(74) *Attorney, Agent, or Firm* — BROADVIEW IP LAW, PC

(57) ABSTRACT

Exemplary embodiments provide a sensing amplifier based flip-flop applying a nonvolatile memory device which is applicable to a mobile device which has a small hardware area, uses a small control signal, does not include a separate write circuit, has low writing power consumption, a short reading time and small power consumption, and requires a low power operation.

17 Claims, 45 Drawing Sheets

Timing diagram

Timing diagram

|  | MTJ based | ReRAM based | | First type | Second type |
|---|---|---|---|---|---|
| NV materials | STT-MTJ | ReRAM | | FeFET | FeFET |
| Structure | SA-merged | SA-merged | | SA-merged | Latch-merged |
| Additional TRs | 26 TRs + 2 MTJs | 12 TRs + 2 ReRAMs | 14 TRs + 2 ReRAMs | 4 TRs + 2 FeFETs | 2 TRs + 2 FeFETs |
| Control signals | 4 | 3 | | 2 | 1 |
| Backup energy | 500 fJ | 12 pJ | | few fJ | few fJ |
| Restore energy | High | High | | High | Low |
| Restore time | V$_{DD}$ rising time + 1 CLK cycle | V$_{DD}$ rising time + 1 CLK cycle | | V$_{DD}$ rising time + 1 CLK cycle | V$_{DD}$ rising time |

FIG. 45

FERROELECTRIC FET NONVOLATILE SENSE-AMPLIFIER-BASED FLIP-FLOP

This study relates to a research project of National Research Foundation of Korea (Grant NRF-2019M3F3A1A02071969, Grant NRF-2019M3F3A1A02071966).

CROSS-REFERENCE TO RELATED APPLICATIONS

This application claims priority to and the benefit of Korean Patent Application No. 10-2021-0070409 filed in the Korean Intellectual Property Office on May 31, 2021, the entire contents of which are incorporated herein by reference.

TECHNICAL FIELD

A technical field of the present disclosure relates to a nonvolatile flip-flop.

BACKGROUND ART

The contents described in this section merely provide background information on the present exemplary embodiment but do not constitute the related art.

In accordance with rapid growth of battery-based mobile devices such as IoT (Internet of Things) devices, cell phones, and electric vehicles, a low-power operation is becoming a more important indicator than an operating speed.

An effective and simple method for a low-power operation is to reduce a driving voltage $V_{DD}$ of a system-on-chip (SoC). When the VDD becomes low, a speed of a transistor exponentially reduces and a process variation increases, which adversely affects the performance.

SoC is configured by a sequential logic circuit and a combinational logic circuit and an a flip-flop which stores data therebetween occupies a large proportion. In order to minimize the adverse effect caused by the use of low $V_{DD}$, it is important to use a flip-flop with the smallest performance degradation at a low $V_{DD}$ as much as possible.

The size of the transistor is gradually reduced to improve a degree of integration so that a threshold voltage is lowered in accordance with the lowering of the driving voltage of the SoC. Therefore, there is a problem in that the leakage current of the turned-off transistor is increased. The leakage current is significantly reduced by shutting off the power by means of power gating, which is used in many digital circuits.

When the power supply stops, the existing volatile system loses the held data so that it takes a lot of time and power to restore previous data in a cold state for booting for next operation. In order to maintain the data, the power cannot be completely shut off, so that a leakage current continuously occurs, resulting in continued use of power.

RELATED ART DOCUMENT

Patent Document

Patent Document 1: KR 10-2154352 (2020 Sep. 10)
Patent Document 2: KR 10-0482996 (2005 Apr. 15)
Patent Document 3: U.S. Pat. No. 6,924,663 (2005 Aug. 2)

SUMMARY OF THE INVENTION

Exemplary embodiments of the present disclosure relate to a sense amplifier based flip-flop including a nonvolatile memory device and a main object of the exemplary embodiments of the present disclosure is to be applied to a mobile device which has a small hardware area, uses a small control signal, does not include a separate write circuit, has low writing power consumption, a short reading time and small power consumption, and requires a low power operation.

Other and further objects of the present invention which are not specifically described can be further considered within the scope easily deduced from the following detailed description and the effect.

According to an aspect of the present embodiment, a nonvolatile flip-flop includes: a sense amplifier which receives a data input signal and a data bar input signal and outputs a set bar signal and a reset bar signal; a latch which is connected to the sense amplifier and receives the set bar signal and the reset bar signal and outputs a data output signal and a data bar output signal; and a nonvolatile storage element which is connected to the sense amplifier or the latch and is applied with a ferroelectric transistor.

The nonvolatile flip-flop uses a state change of the ferroelectric transistor to operate in a normal mode, a standby mode, or a restore mode without having a separate backup mode.

The nonvolatile storage element includes a plurality of ferroelectric transistors and the plurality of ferroelectric transistors have opposite states and the state represents a low resistance state (LRS) or a high resistance state (HRS).

The nonvolatile storage element is connected to the sense amplifier and the nonvolatile storage element includes a first type of a first ferroelectric transistor and a first type of second ferroelectric transistor connected to a node through which a set bar signal is output and a node through which a reset bar is output A first terminal of the first type of first ferroelectric transistor is connected to a node through which the set bar signal is output and a control terminal of the first type of first ferroelectric transistor is connected to a node through which the reset bar signal is output.

A first terminal of the first type of second ferroelectric transistor is connected to a node through which the reset bar signal is output and a control terminal of the first type of second ferroelectric transistor is connected to a node through which the set bar signal is output.

The nonvolatile storage element includes: a first type of first additional transistor which is connected to the first type of first ferroelectric transistor and is controlled by a restore signal; and a first type of second additional transistor which is connected to the first type of second ferroelectric transistor and is controlled by a restore signal.

The nonvolatile storage element includes: a first type of third additional transistor which is connected to a transistor controlled by the data input signal and is controlled by a normal mode signal; and a first type of fourth additional transistor which is connected to a transistor controlled by the data input signal and is controlled by a normal mode signal.

A first terminal of the first type of first additional transistor is connected to the first type of first ferroelectric transistor and a second terminal of the first type of first additional transistor is connected to the first type of third additional transistor.

A first terminal of the first type of second additional transistor is connected to the first type of second ferroelectric transistor and a second terminal of the first type of second additional transistor is connected to the first type of fourth additional transistor.

A first terminal of the first type of third additional transistor is connected to a transistor controlled by a data input signal, a first terminal of the first type of fourth additional transistor is connected to a transistor controlled by the data bar input signal, and a second terminal of the first type of third additional transistor and a second terminal of the first type of fourth additional transistor are connected to the transistor controlled by a clock signal.

In the restore mode which is activated by the restore signal, a rising time of a driving voltage and one clock cycle are consumed.

The nonvolatile storage element is connected to the latch and the nonvolatile storage element includes a second type of first ferroelectric transistor and a second type of second ferroelectric transistor connected to a node through which the data output signal is output and a node through which the data bar output signal is output.

A first terminal of the second type of first ferroelectric transistor is connected to a node through which the data output signal is output and a control terminal of the second type of first ferroelectric transistor is connected to a node through which the data bar output signal is output.

A first terminal of the second type of second ferroelectric transistor is connected to a node through which the data bar output signal is output and a control terminal of the second type of second ferroelectric transistor is connected to a node through which the data output signal is output.

The nonvolatile storage element includes: a second type of first additional transistor which is connected to the second type of first ferroelectric transistor and is controlled by a restore signal; and a second type of second additional transistor which is connected to the second type of second ferroelectric transistor and is controlled by a restore signal.

In the restore mode which is activated by the restore signal, a driving voltage rising time is consumed.

As described above, according to the exemplary embodiments of the present disclosure, a sense amplifier based flip-flop including a nonvolatile memory device may be applied to a mobile device which has a small hardware area, uses a small control signal, does not include a separate write circuit, has low writing power consumption, a short reading time and small power consumption, and requires a low power operation.

Even if the effects are not explicitly mentioned here, the effects described in the following specification which are expected by the technical features of the present disclosure and their potential effects are handled as described in the specification of the present disclosure.

BRIEF DESCRIPTION OF THE DRAWINGS

FIG. 45 is a table in which exemplary embodiments of the present disclosure are compared and summarized.

DETAILED DESCRIPTION OF THE EMBODIMENT

Hereinafter, in the description of the present disclosure, a detailed description of the related known functions will be omitted if it is determined that the gist of the present disclosure may be unnecessarily blurred as it is obvious to those skilled in the art and some exemplary embodiments of the present disclosure will be described in detail with reference to exemplary drawings.

Figure 1:
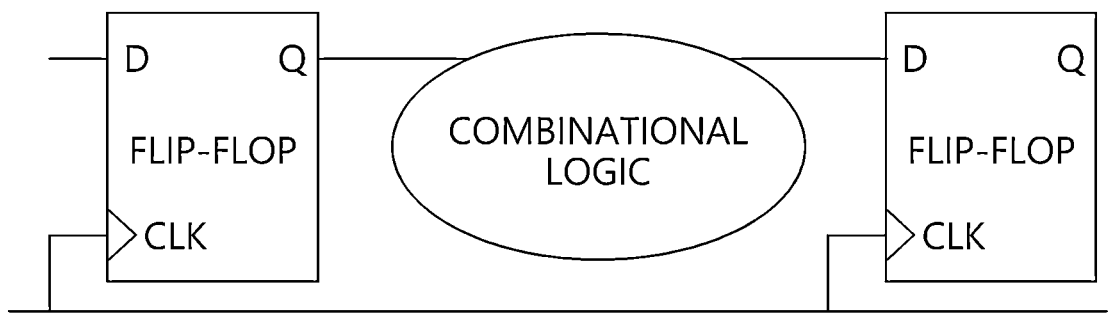
FIG. 1 is a view illustrating a flip-flop.
Figure 2:
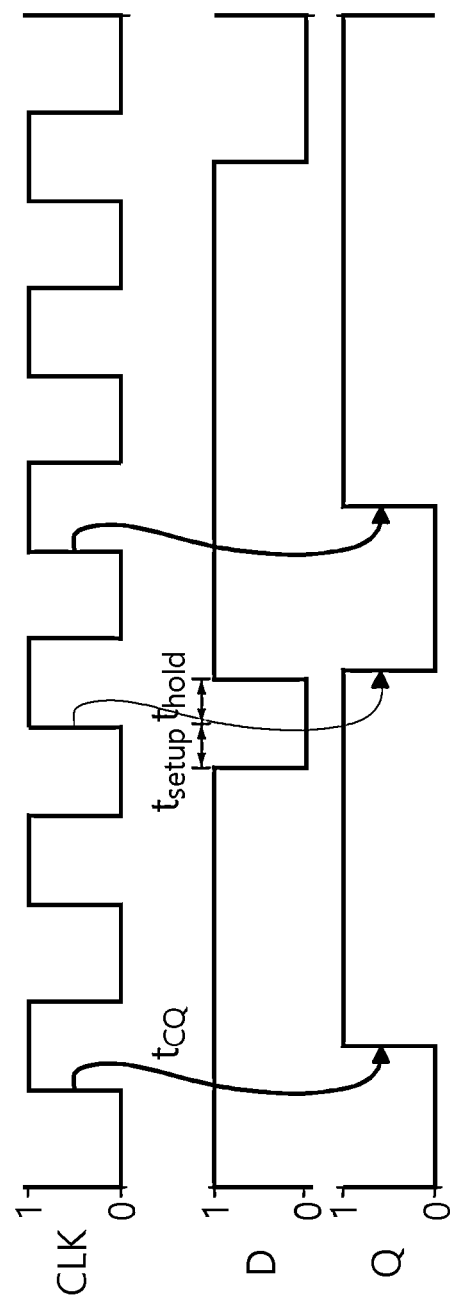
FIGS. 2 and 3 are exemplary timing charts of an operation of a flip-flop.
Figure 3:
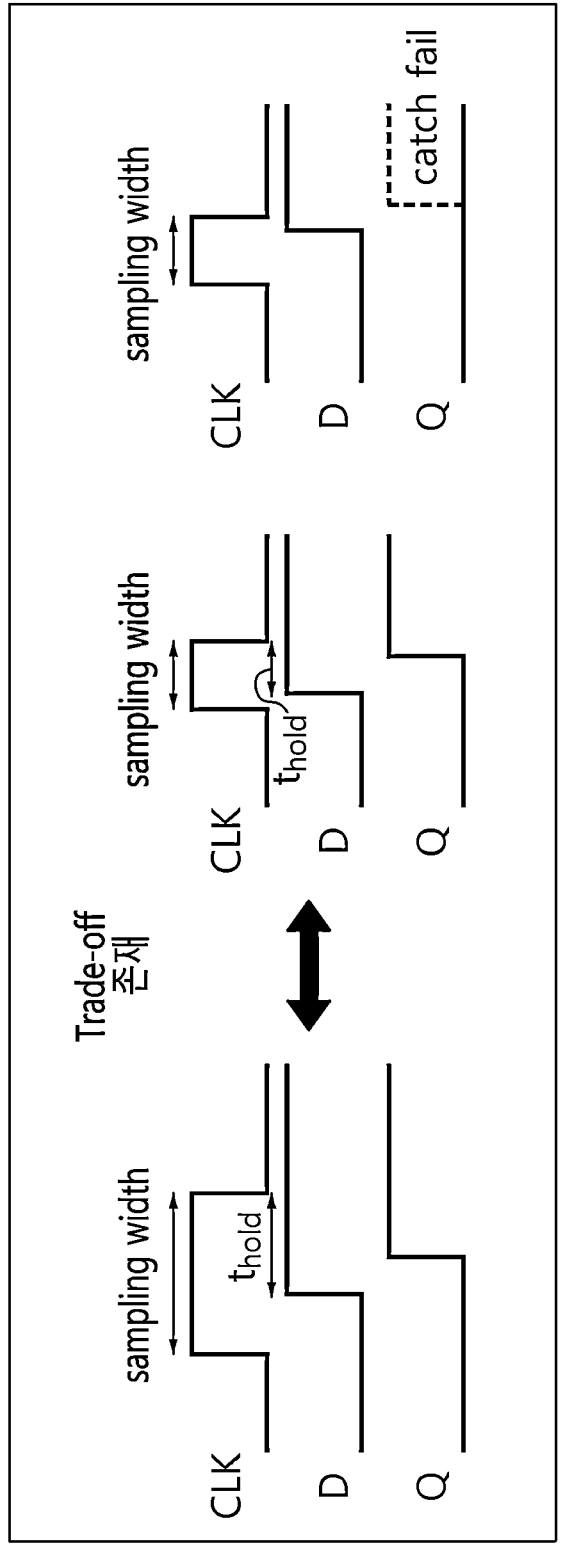

FIG. 1 is a view illustrating a flip-flop and FIGS. 2 and 3 are exemplary timing charts of an operation of a flip-flop.

A flip-flop is a basic element of a sequential circuit which stores and latches one bit of information. The flip-flop is present between combinational logics and interlocks with a clock (CLK) signal to store and update data. The flip-flop sends an input value D as an output value Q at an instantaneous edge of the CLK signal and latches the data until a next CLK edge.

A performance indicator of the flip-flop includes (i) $t_{CQ}$, $t_{setup}$, (iii) $t_{hold}$.

$t_{CQ}$ (CLK-to-Q delay) is a time until the Q is output from the CLK edge and the smaller value is better.

$t_{setup}$ (setup time) is a minimum time that a D value needs to be prepared before the CLK edge. $t_{setup}$ is a time for stably outputting Q and a lower value is better.

$t_{hold}$ (hold time) is a minimum time that the D value needs to be maintained after the CLK edge. $t_{hold}$ is a time for stably outputting Q and a lower value is better.

Due to the growth of battery based mobile SoC devices with a limited energy, a low power operation becomes an important indicator more than the operation speed. A low driving voltage $V_{DD}$ may be used for the low-power operation.

Due to the low VDD, the performance is significantly degraded and an importance of the leakage current is increased. In order to minimize this problem, a small combinational logic is used between the flip-flops to reduce an idle combinational logic which does not operate and has a leakage current flowing therethrough to increase the power efficiency. The importance of the flip-flop increases and a flip-flop which has a low power operation, a fast $t_{CQ}$, and a small CLK load is necessary.

The influence of the process variation is increased and a driving strength variation of the transistor at a low VDD is very large so that a flip-flop which has minimum influence thereby is necessary.

A long sampling width is related to a long $t_{hold}$. A short sampling width is related to short $t_{hold}$, but it may fail to catch D.

Figure 4:
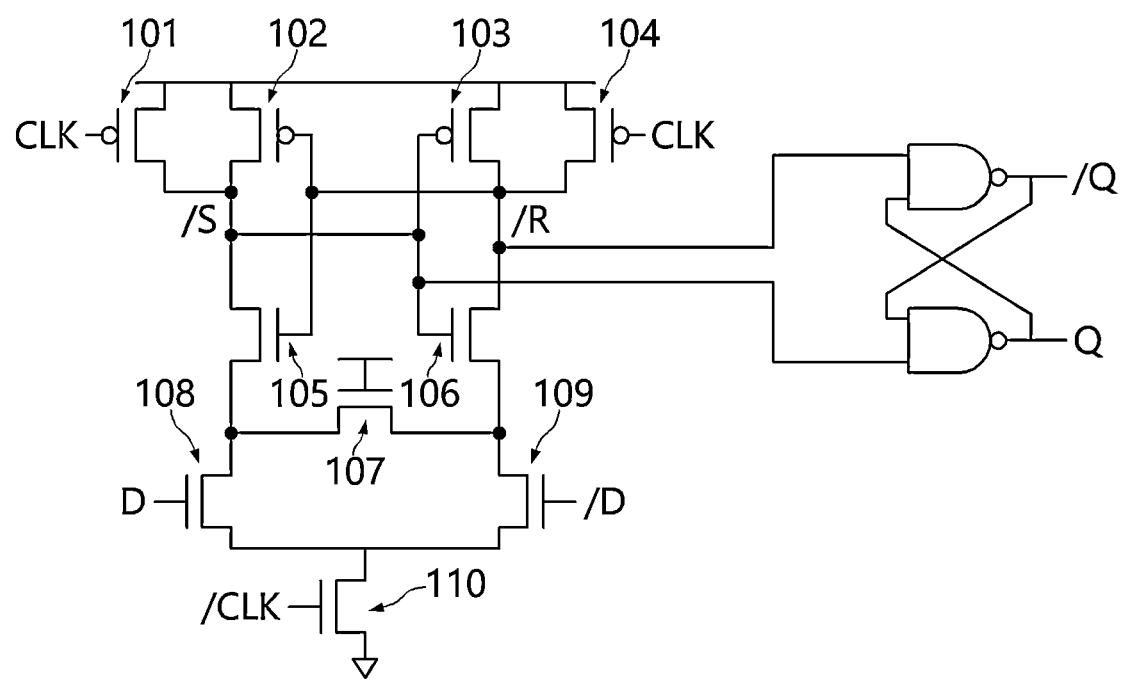
FIG. 4 is an exemplary circuit diagram of a sense amplifier based flip-flop.
Figure 5:
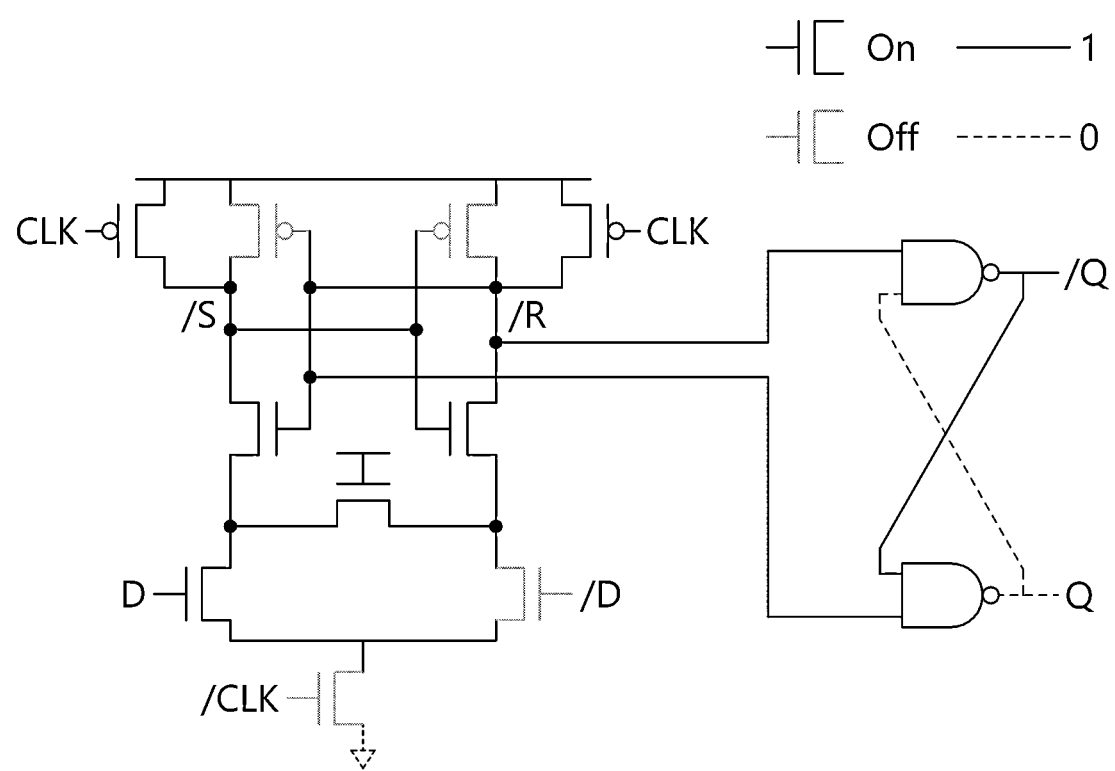
FIGS. 5 and 7 are exemplary circuit diagrams for explaining an operation of a sense amplifier based flip-flop.
Figure 6:
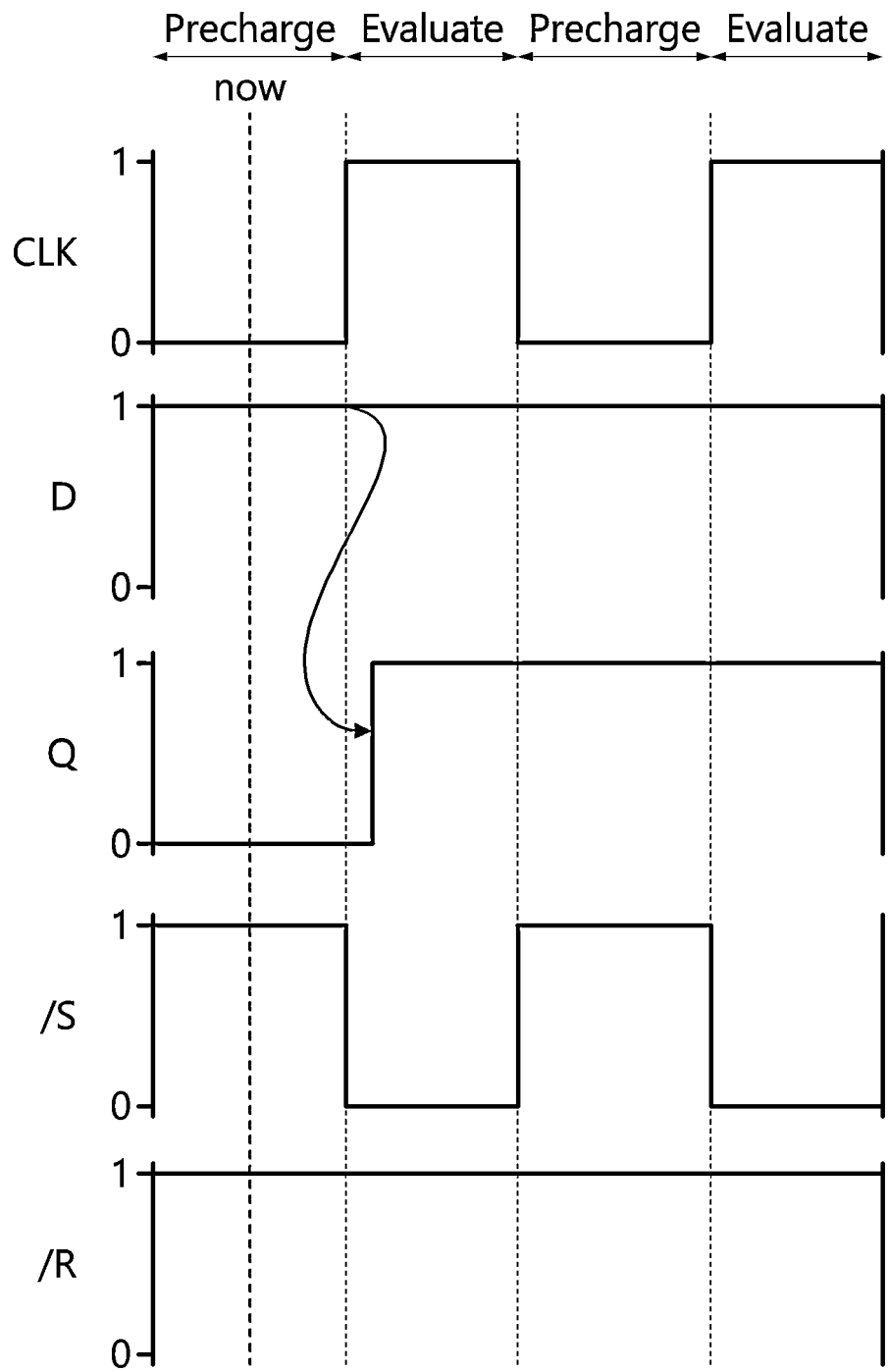
FIGS. 6 and 8 are exemplary circuit diagrams for explaining an operation of a sense amplifier based flip-flop.
Figure 7:
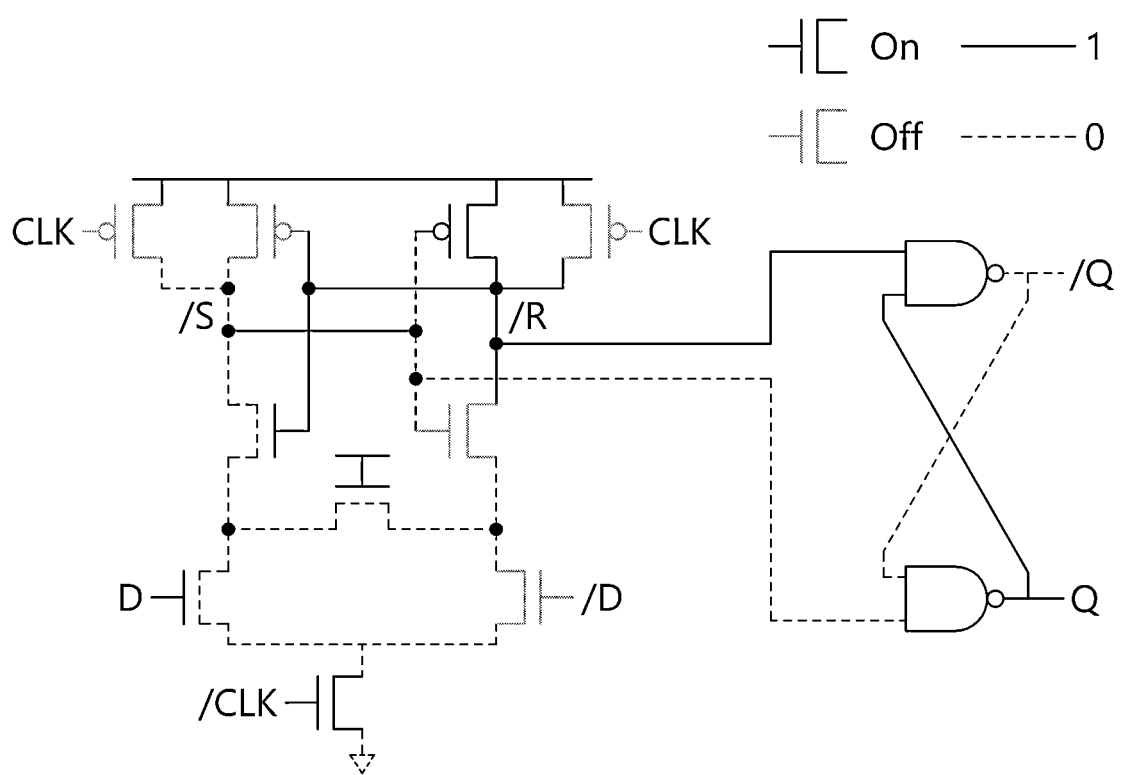
Figure 8:
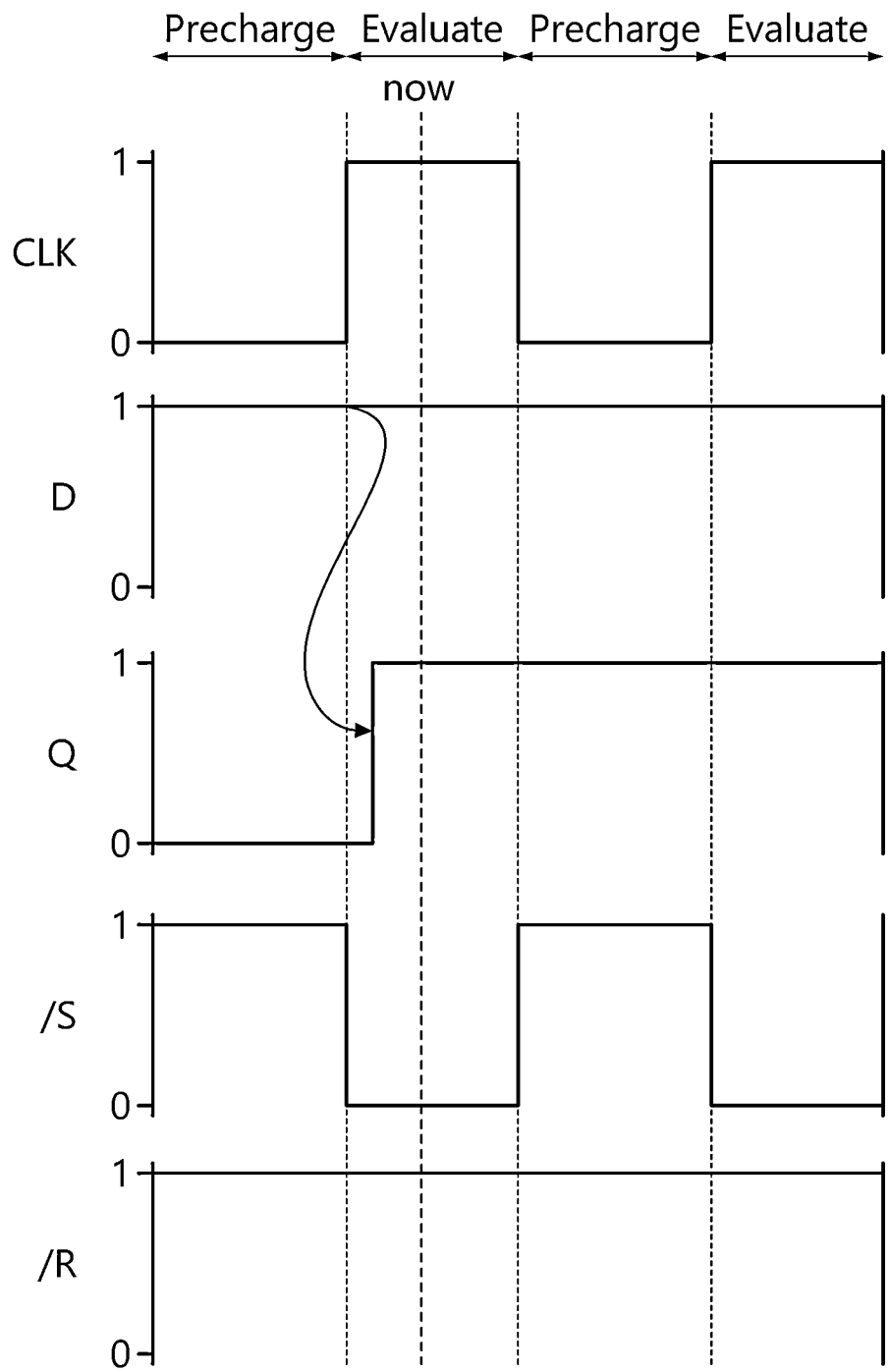

FIG. 4 is an exemplary circuit diagram of a sense amplifier based flip-flop. FIGS. 5 and 7 are exemplary circuit diagrams for explaining an operation of a sense amplifier based flip-flop. FIGS. 6 and 8 are exemplary circuit diagrams for explaining an operation of a sense amplifier based flip-flop.

The sense amplifier based flip-flop (SAFF) holds D during CLK=1 to fetch D to Q. At the low $V_{DD}$, $t_{setup}$ does not affect. After changing Q, D is not captured to solve the size problem. $t_{setup}$ is small (negative value). A true single phase CLK is used to consume a small CLK power by a small CLK load. The problems such as large delay of the SR latch and transistor mismatch may be overcome by an improved circuit technique.

Referring to FIG. 4, the sense amplifier includes a first transistor 101, a second transistor 120, a third transistor 103, a fourth transistor 104, a fifth transistor 105, a sixth transistor 106, a seventh transistor 107, an eighth transistor 108, and a ninth transistor 109.

The first transistor 101, the second transistor 102, the third transistor 103, and the fourth transistor 104 are implemented by PMOS transistors and the fifth transistor 105, the sixth transistor 106, the seventh transistor 107, the eighth transistor 108, and the ninth transistor 109 may be implemented by NMOS transistors.

The first transistor 101 and the fourth transistor 104 are controlled by a clock signal, the eighth transistor 108 is controlled by a data input signal, and the ninth transistor 109 is controlled by a data bar input signal.

A set bar signal and a reset bar signal may be transmitted to the latch.

Referring to FIGS. 5 and 6, in a precharge phase of a sense amplifier (SA) stage, CLK=0 and /S=/R=1. In a precharge phase of a latch stage (SR latch stage), CLK=0 and Q, /Q values are maintained.

Referring to FIGS. 7 and 8, in an evaluation phase of a sense amplifier (SA) stage, CLK=1 and one of /S and /R is discharged. In an evaluation phase of a latch stage (SR latch stage), CLK=1 and one of /S and /R is discharged to determine Q and /Q values.

Figure 9:
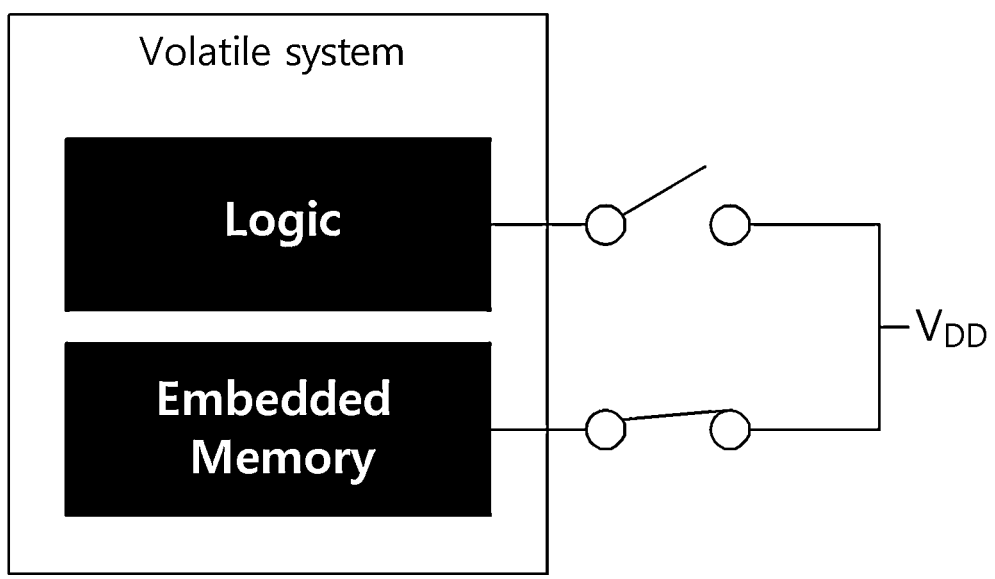
FIG. 9 is a view illustrating a volatile system.
Figure 10:
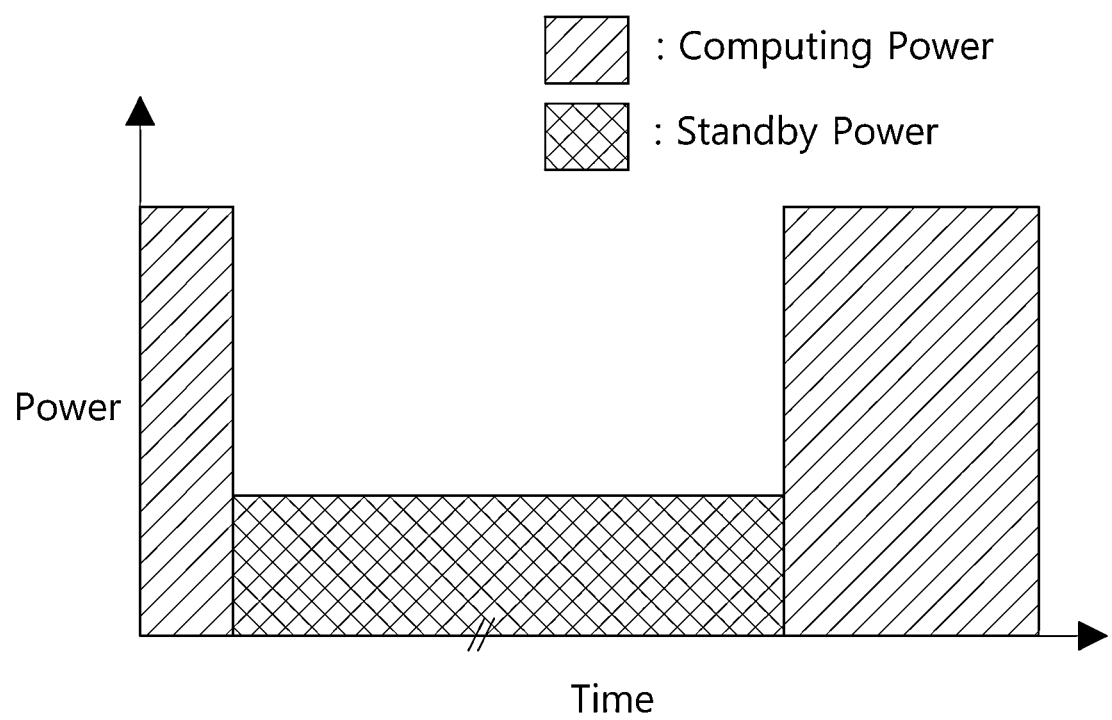
FIG. 10 is a view illustrating a consumed power of a volatile system.

FIG. 9 is a view illustrating a volatile system and FIG. 10 is a view illustrating a consumed power of a volatile system.

In the volatile system, in accordance with the improvement of the degree of the transistor integration, the driving voltage VDD and the threshold voltage VTH of the system-on-chip (SoC) are lowered so that the influence of the leakage current is increased. Normally-off and instantly-on devices, such as Internet-of-things (IoT) devices, do not operate in the most of time to be turned off. It is important to reduce the leakage current in the turned-off state. When the device is turned off, the power is shut off by means of the power gating to reduce significant leakage current. However, in the existing volatile system, when the power supply stops, data which is being operated is lost and the power is not completely shut off to maintain the data so that the leakage current is caused.

Figure 11:
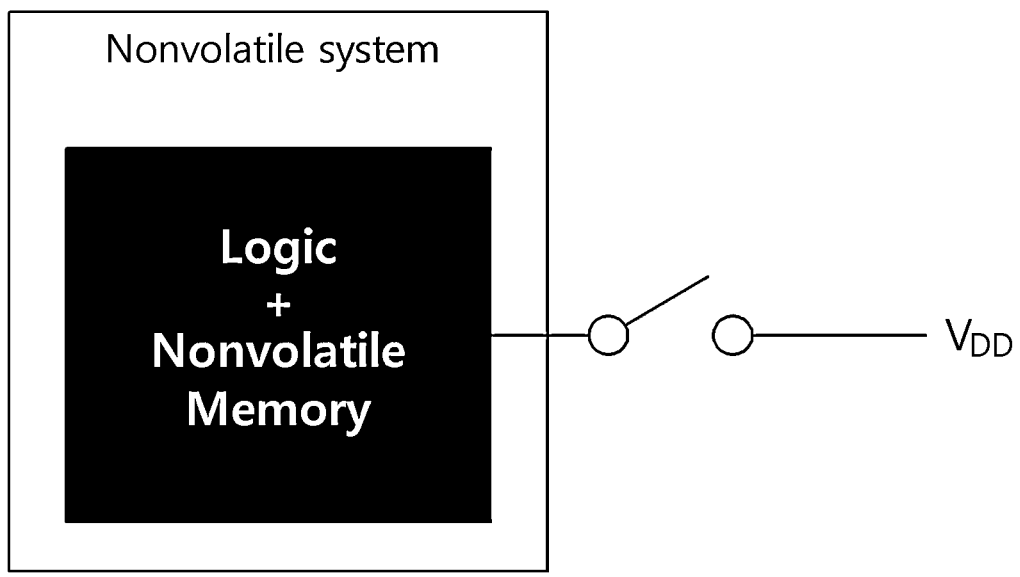
FIG. 11 is a view illustrating a nonvolatile system.
Figure 12:
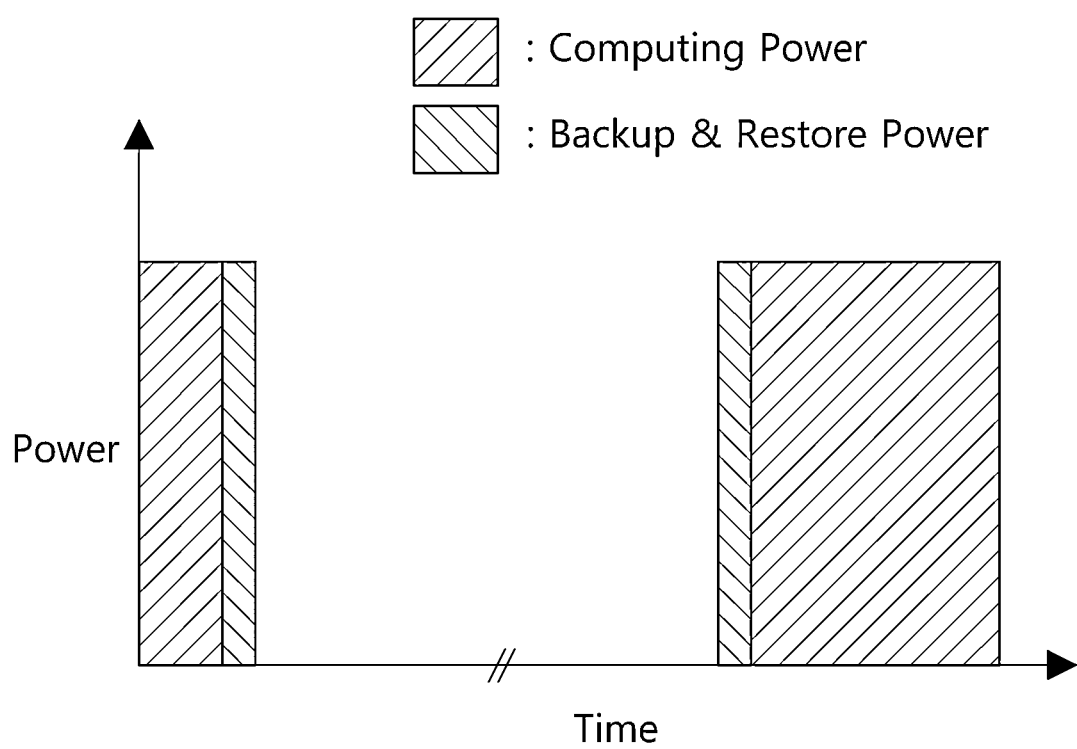
FIG. 12 is a view illustrating a consumed power of a nonvolatile system.

FIG. 11 is a view illustrating a nonvolatile system and FIG. 12 is a view illustrating a consumed power of a nonvolatile system.

As the nonvolatile system, the nonvolatile flip-flop (NVFF) integrates the nonvolatile memory (NVM) in a flip-flop which stores data being sequentially operated in a pipeline so that data is not lost even though the power is shut off.

Even though an energy and a time are necessary to store and restore the data in the nonvolatile memory, the leakage current is not generated during the turned-off time, so that a lot of power may be saved.

Specifically, energy-harvesting devices have unstable power sources such as sunlight, vibration, and radio frequency (RF) so that sudden power shut-off is frequently generated to cause data loss. The NVFF may solve this problem.

Figure 13:
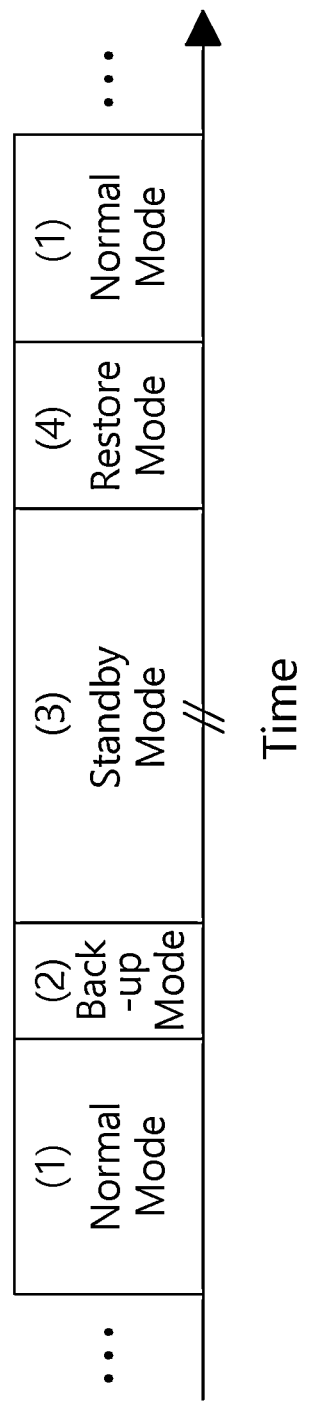
FIG. 13 is a view illustrating an operation mode of a nonvolatile flip-flop.
Figure 14:
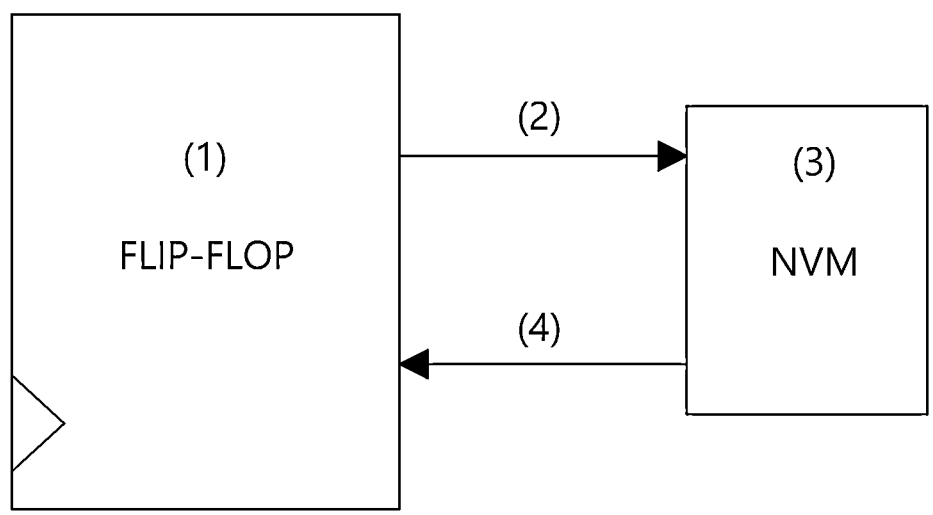
FIG. 14 is a view illustrating a data flow in an operation mode of a nonvolatile flip-flop.

FIG. 13 is a view illustrating an operation mode of a nonvolatile flip-flop and FIG. 14 is a view illustrating a data flow in an operation mode of a nonvolatile flip-flop. In a normal mode, the nonvolatile flip-flop serves as a flip-flop.

In a backup mode, the nonvolatile flip-flop stores data of the flip-flop in a nonvolatile element and NVM. This is a sort of writing mode. A state of the NVM is determined according to stored data (logic I/O).

In the standby mode, the power is completely shut so that the leakage current is not generated and the data stored in the NVM is maintained.

In the restore mode, data stored in the NVM is restored. This is a sort of reading mode. All nodes start at 0 V and data (logic I/O) stored in the NVM is restored in the flip-flop while gradually rising $V_{DD}$.

Figure 15:
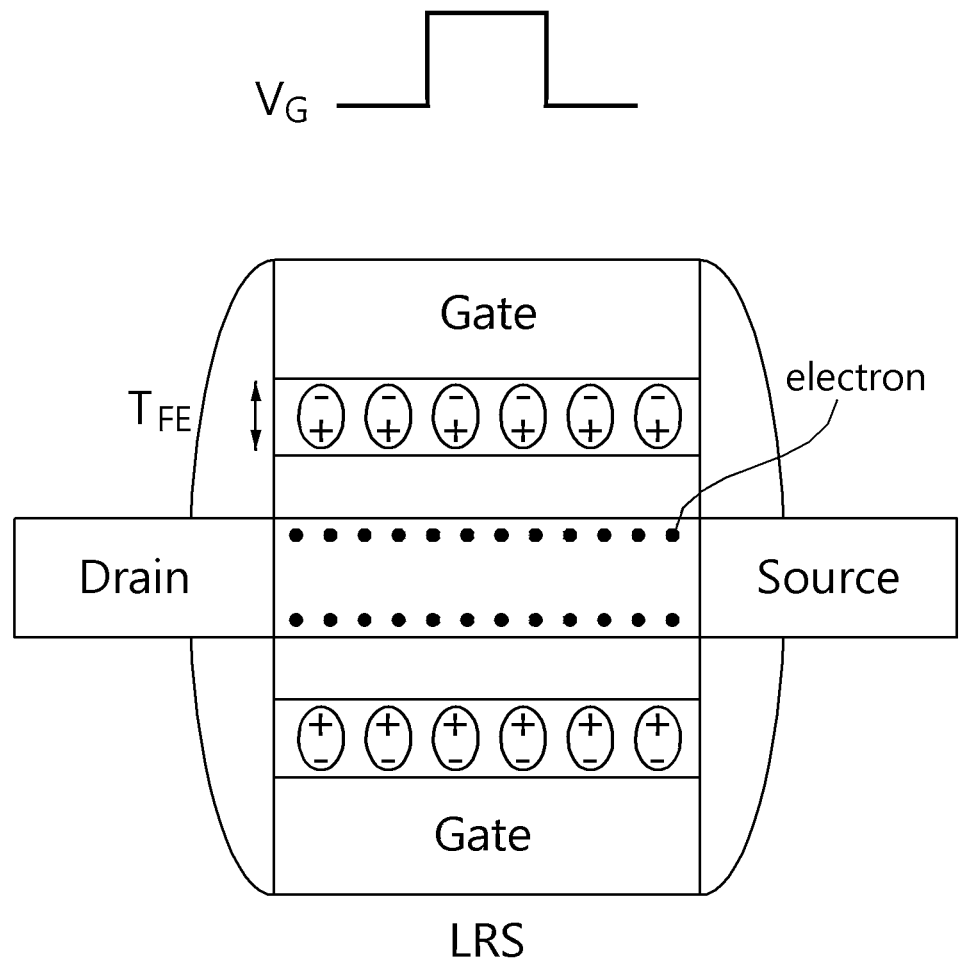
FIGS. 15 and 16 are views illustrating a structure of a ferroelectric transistor.
Figure 16:
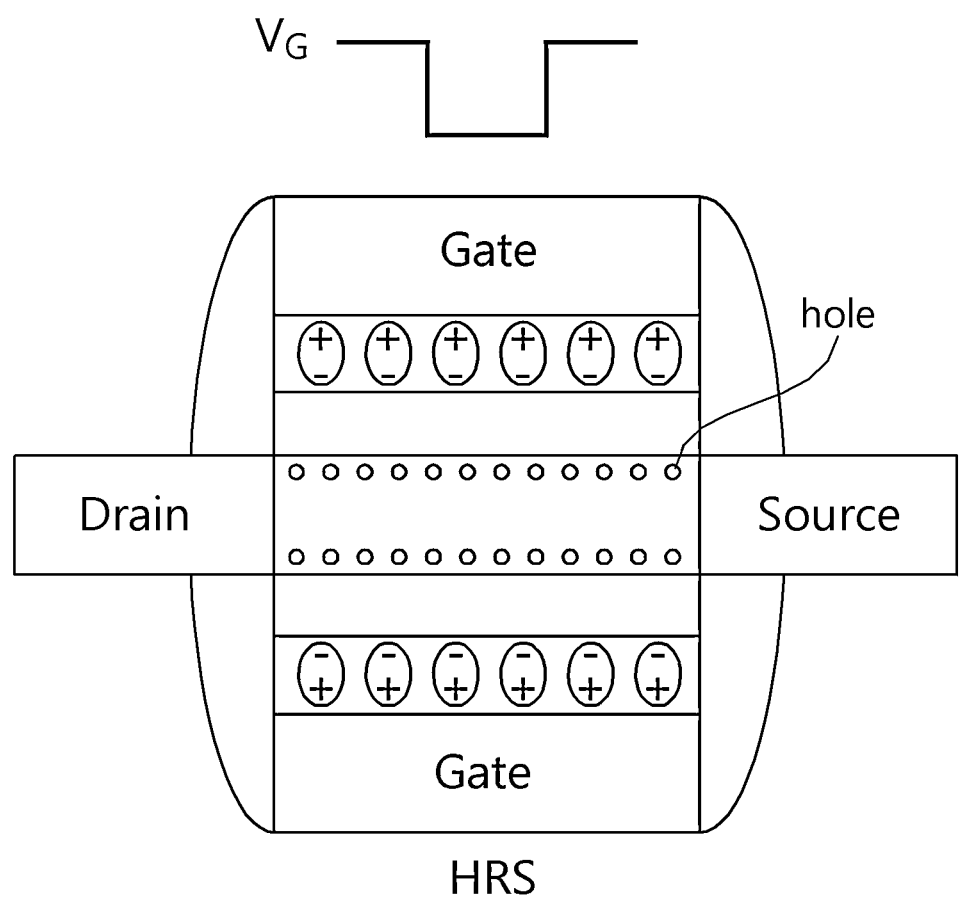
Figure 17:
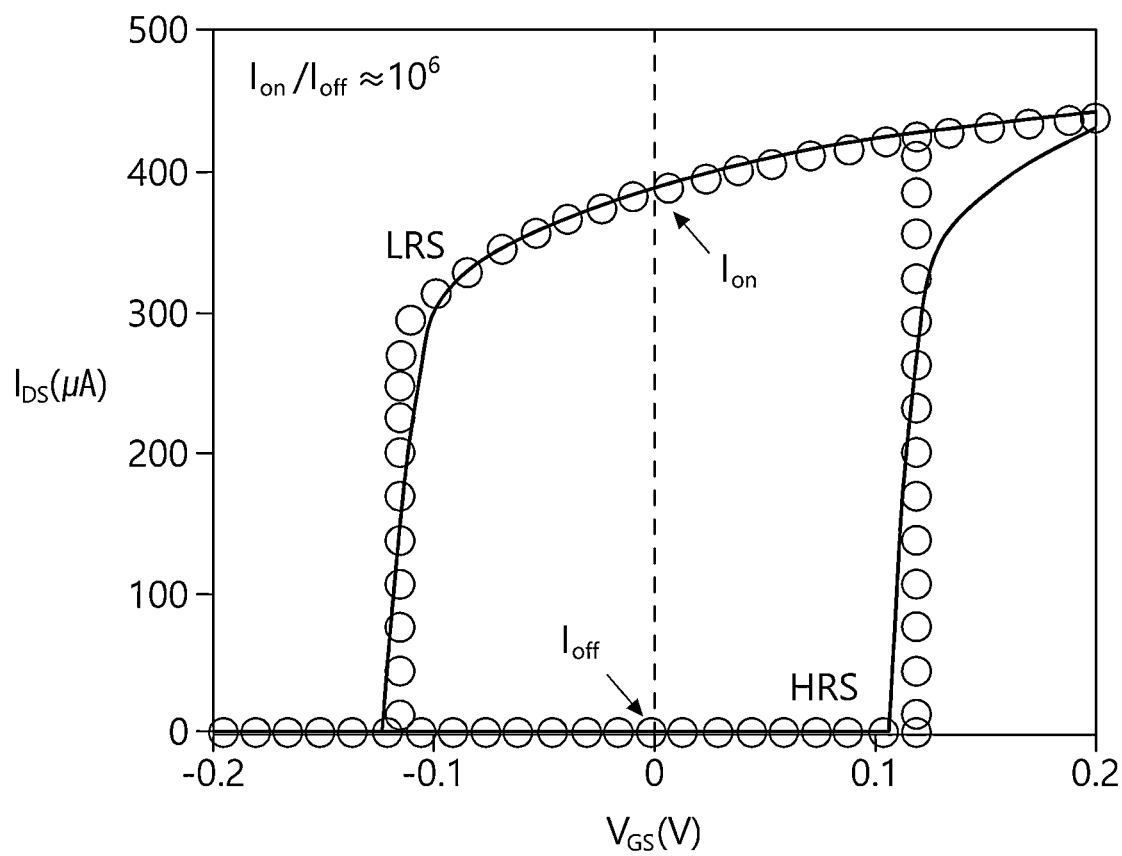
FIG. 17 is a view illustrating a state of a ferroelectric transistor.

FIGS. 15 and 16 are views illustrating a structure of a ferroelectric transistor and FIG. 17 is a view illustrating a state of a ferroelectric transistor.

A ferroelectric layer is added between a gate layer and an insulating layer in the existing MOSFET structure to be utilized as a next-generation nonvolatile element.

The ferroelectrics maintain polarization so that the state of FeFET is determined thereby. The polarization state may be changed by a gate-to-source voltage ($V_{GS}$) or a gate-to-drain voltage ($V_{GD}$) which is higher than a specific voltage $V_C$.

The FeFET state is classified into a low resistance state (LRS) and a high resistance state (HRS).

In the LRS, when $V_{GS}$ ($>V_C$) is applied, polarization of the ferroelectrics is directed to a channel. At this time, electron channel formation is helped to have a low resistance so that when $V_{GS}$=0, a current flows ($I_{on}$).

In the HRS, when $V_{GS}$ ($<-V_C$) is applied, polarization of the ferroelectrics is directed to a gate layer. At this time, electron channel formation is interrupted to have a high resistance so that when $V_{GS}$=0, a current does not flow ($I_{off}$).

STT-MTJ and ReRAM are two-terminal devices to perform current-based writing operation and consume a large writing power due to a static current. An additional circuit (logic gat) is necessary to share a reading/writing route with the two-terminal device and distinguish reading/writing. Therefore, the circuit size is large. A $I_{ON}/I_{OFF}$ ratio is low and a sense amplifier is necessary to distinguish the low $I_{ON}/I_{OFF}$ ratio during the reading operation.

An FeFET based NVFF is a three-terminal device and performs an electric field based writing operation and consumes a small writing power for charging/discharging. A reading/writing route to the three-terminal device is independently present and an additional circuit is not necessary. The circuit size is large. A $I_{ON}/I_{OFF}$ ratio is high (~$10^6$) and a sense amplifier is not necessary during the reading operation.

Figure 18:
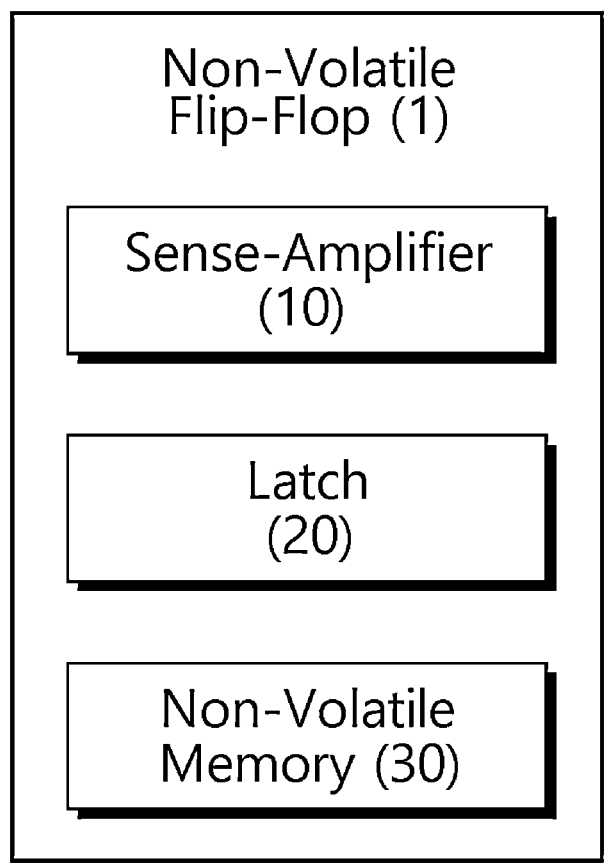
FIG. 18 is a view illustrating a nonvolatile flip-flop according to an exemplary embodiment of the present disclosure.

FIG. 18 is a view illustrating a nonvolatile flip-flop according to an exemplary embodiment of the present disclosure.

The nonvolatile flip-flop 1 includes a sense amplifier 10, a latch 20, and a nonvolatile storage element 30.

The sense amplifier 10 receives a data input signal and a data bar input signal and outputs a set bar signal and a reset bar signal.

The latch 20 is connected to the sense amplifier 10 and receives a set bar signal and a reset bar signal and outputs a data output signal and a data bar output signal.

The nonvolatile storage element 30 is connected to the sense amplifier 10 or the latch 20 and a ferroelectric transistor is applied to the nonvolatile storage device. FIGS. 19 to 36 illustrate a first type of connection structure in which the nonvolatile storage element is connected to the sense amplifier and FIGS. 37 to 44 illustrate a second type of connection structure in which the nonvolatile storage element is connected to the latch.

The nonvolatile flip-flop 1 uses a state change of the ferroelectric transistor to operate in a normal mode, a standby mode, and a restore mode without having a separate backup mode.

The nonvolatile storage element 30 includes a plurality of ferroelectric transistors. A plurality of ferroelectric transistors has opposite states. The state includes a low resistance state (LRS) and a high resistance state (HRS).

Figure 19:
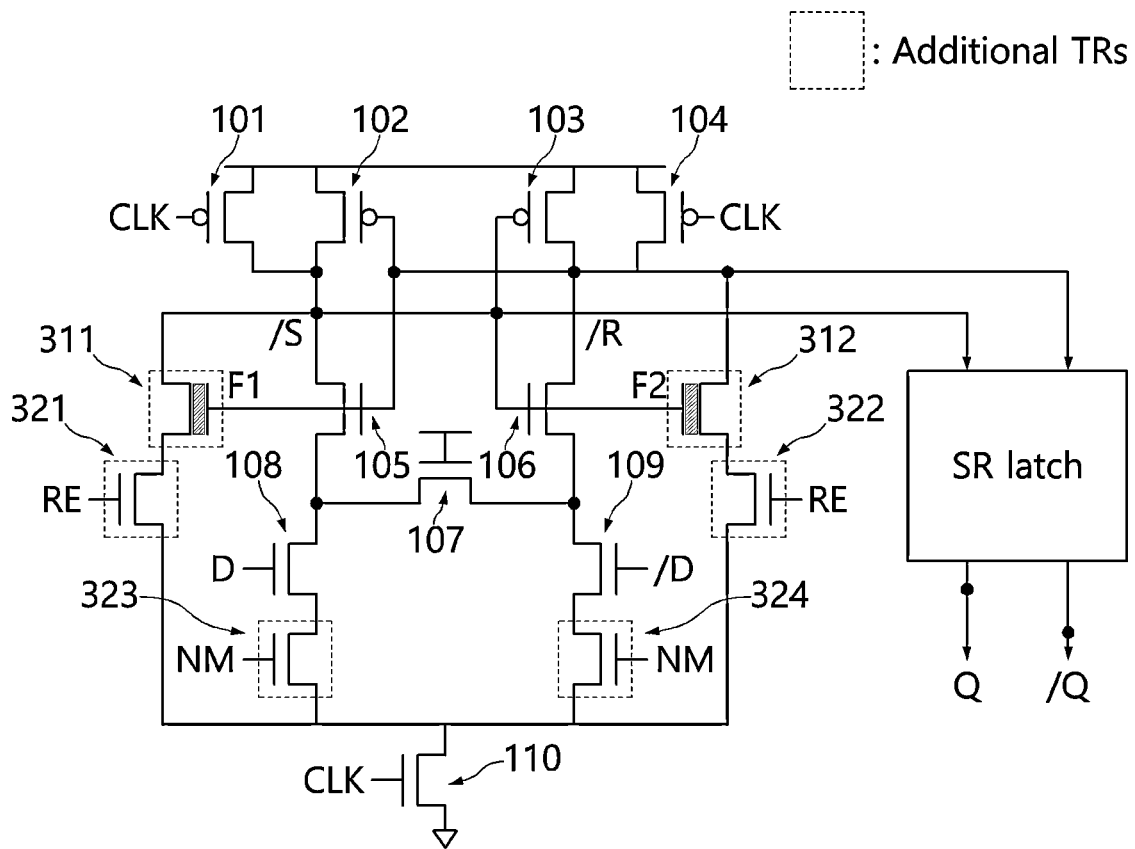
FIG. 19 is a view illustrating a first type of nonvolatile flip-flop according to another exemplary embodiment of the present disclosure.

FIG. 19 is a view illustrating a first type of nonvolatile flip-flop according to another exemplary embodiment of the present disclosure.

The first type has a SA-merged structure in which two FeFETs are added to the SA stage. The additional transistors and elements are four transistors and two FeFETs and occupy a small area. A control signal is RE (restore) and a normal mode (NM). A separate backup mode is not necessary and the state is changed by means of VGA of the FeFET. In the restore mode, data is read through one CLK cycle.

The nonvolatile storage element is connected to the sense amplifier.

The nonvolatile storage element may include a first type of first ferroelectric transistor 311 and a first type of second ferroelectric transistor 312 which are connected to a node through which a set bar signal is output and a node through which a reset bar is output. A first terminal of the transistor may be a drain or a source and a second terminal of the transistor may be a drain or a source.

A first terminal of the first type of first ferroelectric transistor 311 is connected to a node through which the set bar signal is output and a control terminal of the first type of first ferroelectric transistor 311 is connected to a node through which the reset bar signal is output.

A first terminal of the first type of second ferroelectric transistor 312 is connected to a node through which the reset bar signal is output and a control terminal of the first type of second ferroelectric transistor 312 is connected to a node through which the set bar signal is output.

The nonvolatile storage element includes a first type of first additional transistor 321 which is connected to the first type of first ferroelectric transistor 311 and is controlled by a restore signal and a first type of second additional transistor 322 which is connected to the first type of second ferroelectric transistor 312 and is controlled by a restore signal. In the restore mode which is activated by the restore signal, a rising time of a driving voltage and one clock cycle are consumed.

The nonvolatile storage element includes a first type of third transistor 323 which is connected to a transistor controlled by a data input signal and is controlled by a normal mode signal and a first type of fourth transistor 324 which is connected to a transistor controlled by a data bar input signal and is controlled by a normal mode signal. A first terminal of the first type of first additional transistor 321 is connected to a first type of first ferroelectric transistor 311 and a second terminal of the first type of first additional transistor 321 is connected to a first type of third additional transistor 323.

A first terminal of the first type of second additional transistor 322 is connected to a first type of second ferroelectric transistor 312 and a second terminal of the first type of second additional transistor 322 is connected to a first type of fourth additional transistor 324.

A first terminal of the first type of third additional transistor 323 is connected to a transistor controlled by a data input signal, a first terminal of the first type of fourth additional transistor 324 is connected to a transistor controlled by a data bar input signal, and a second terminal of the first type of third additional transistor 323 and a second terminal of the first type of fourth additional transistor 324 are connected to the transistor controlled by a clock signal.

An operation that Q is changed from 0 to 1 in a normal mode (+backup mode) will be described.

Figure 20:
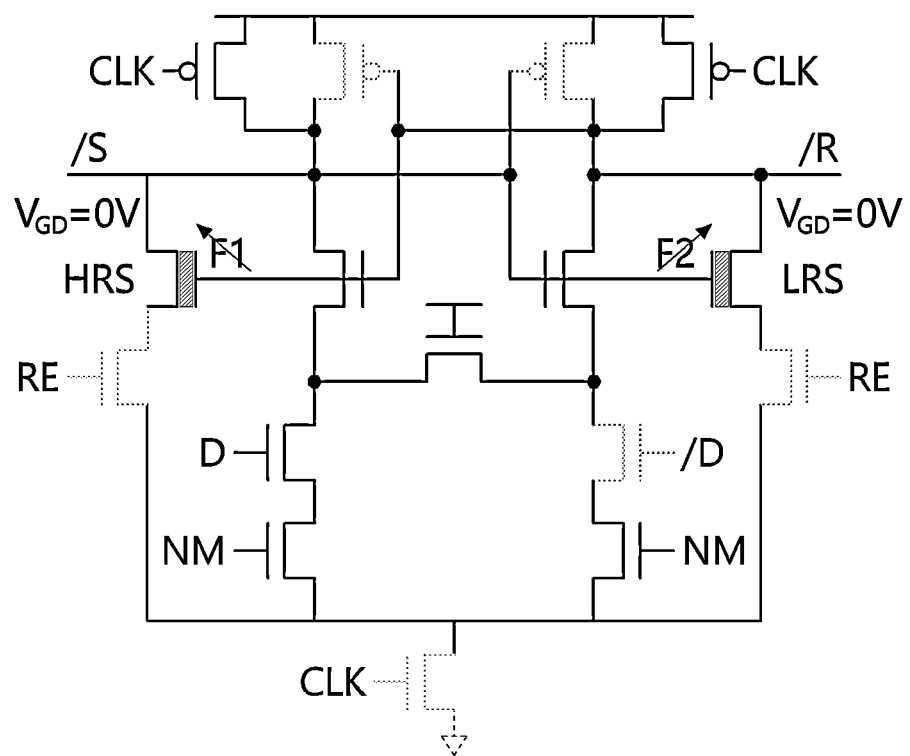
FIGS. 20, 22, 24, 26, 28, 30, 32, and 34 are exemplary circuit diagrams of an operation of a first type of nonvolatile flip-flop according to another exemplary embodiment of the present disclosure.
Figure 21:
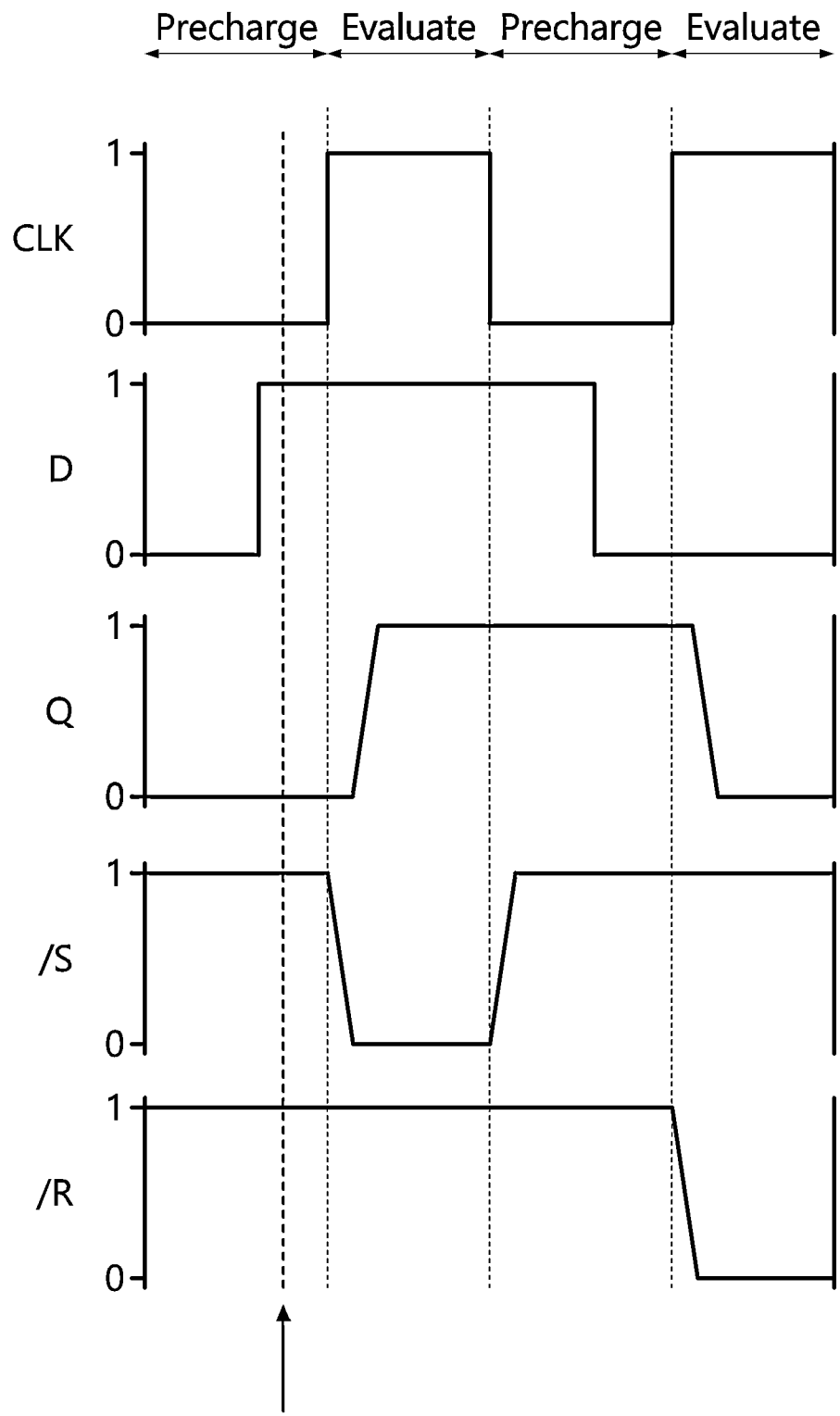
FIGS. 21, 23, 25, 27, 29, 31, 33, 35, and 36 are exemplary timing charts of an operation of a first type of nonvolatile flip-flop according to another exemplary embodiment of the present disclosure.

Referring to FIGS. 20 and 21, $V_{GD}=0$ V and an FeFET state is maintained. Q=0 and /Q=1 are latched.

Figure 22:
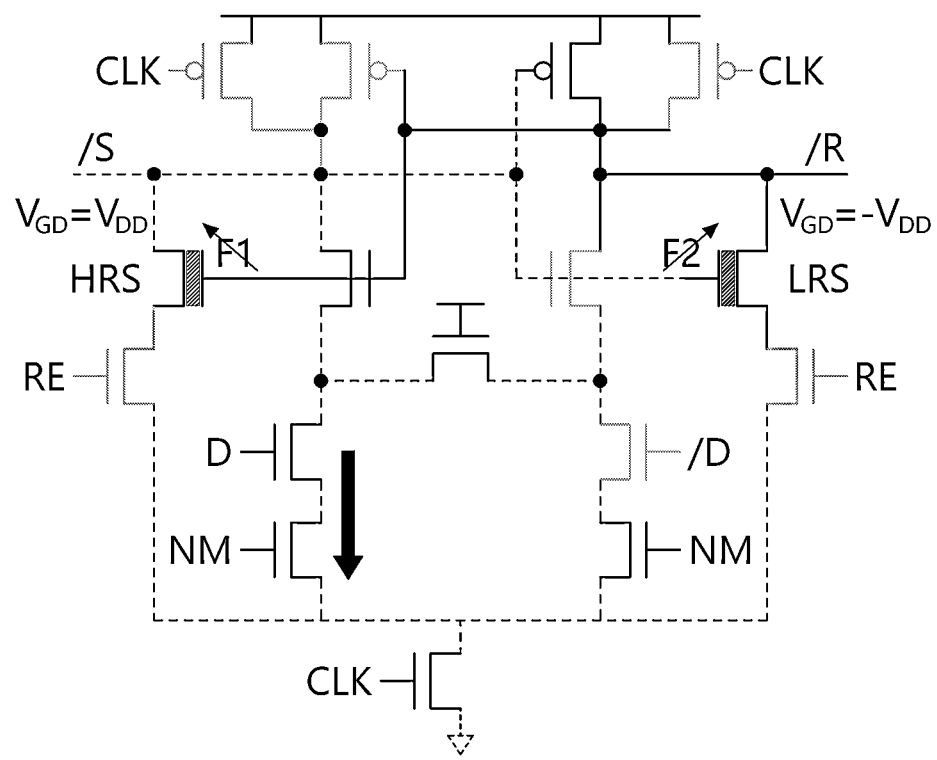
Figure 23:
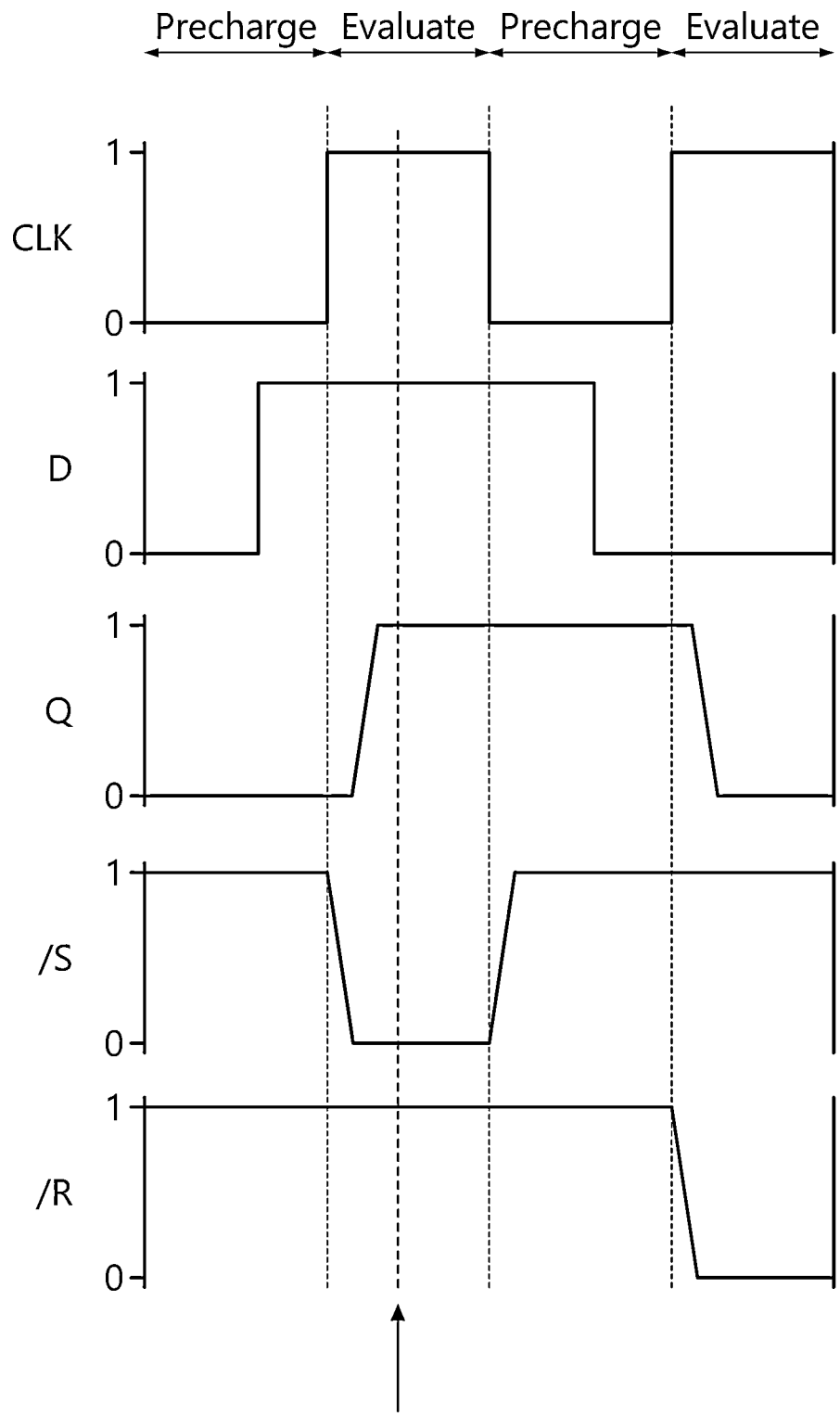

Referring to FIGS. 22 and 23, D is changed to 1 and /S is discharged to 0, Q is transited to 1 and /Q is transited to 0.

Figure 24:
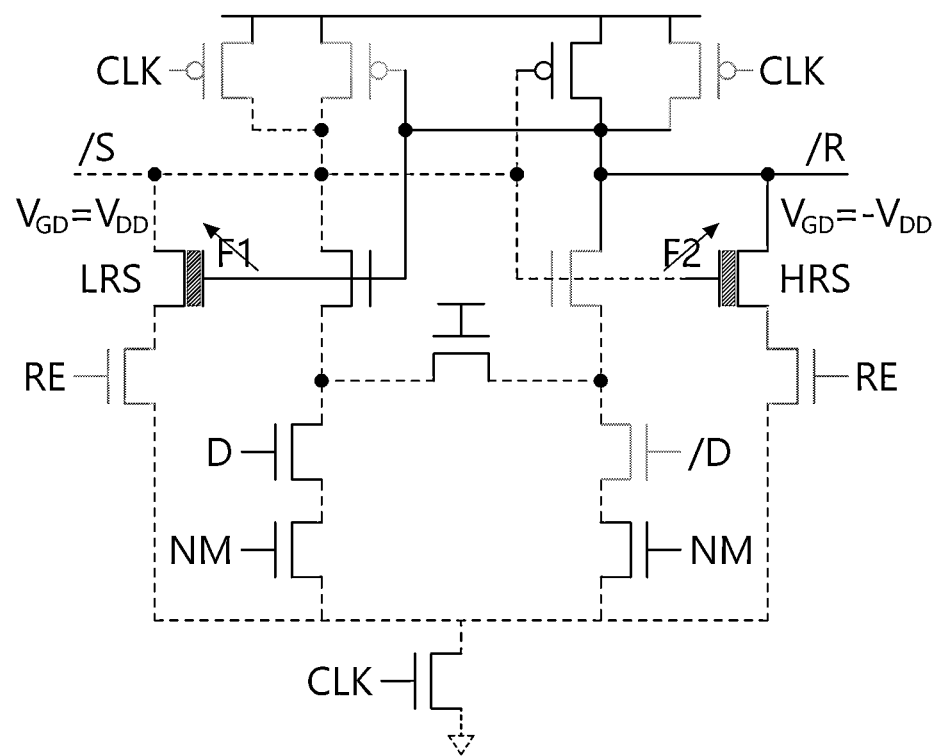
Figure 25:
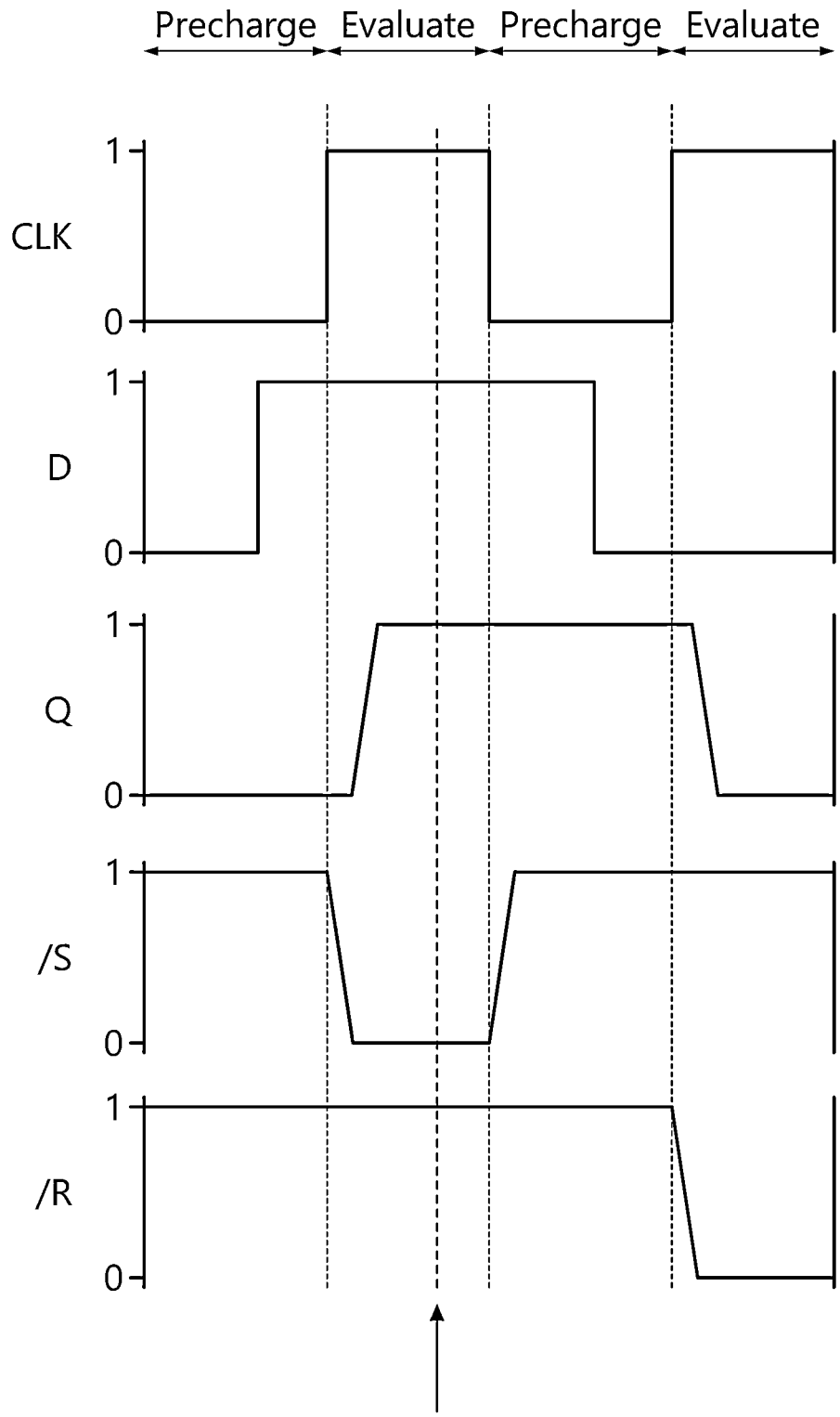

Referring to FIGS. 24 and 25, the FeFET state is automatically changed according to $V_{GD}$ (in the existing STT-MTJ and ReRAM, a separate backup mode is present).

When Q is 1 and /Q is 0, F1 is changed to LRS ($V_{GD}=V_{DD}$), and F2 is changed to HRS ($V_{GD}=-V_{DD}$).

An operation that Q is changed from 1 to 0 in a normal mode (+backup mode) will be described.

Figure 26:
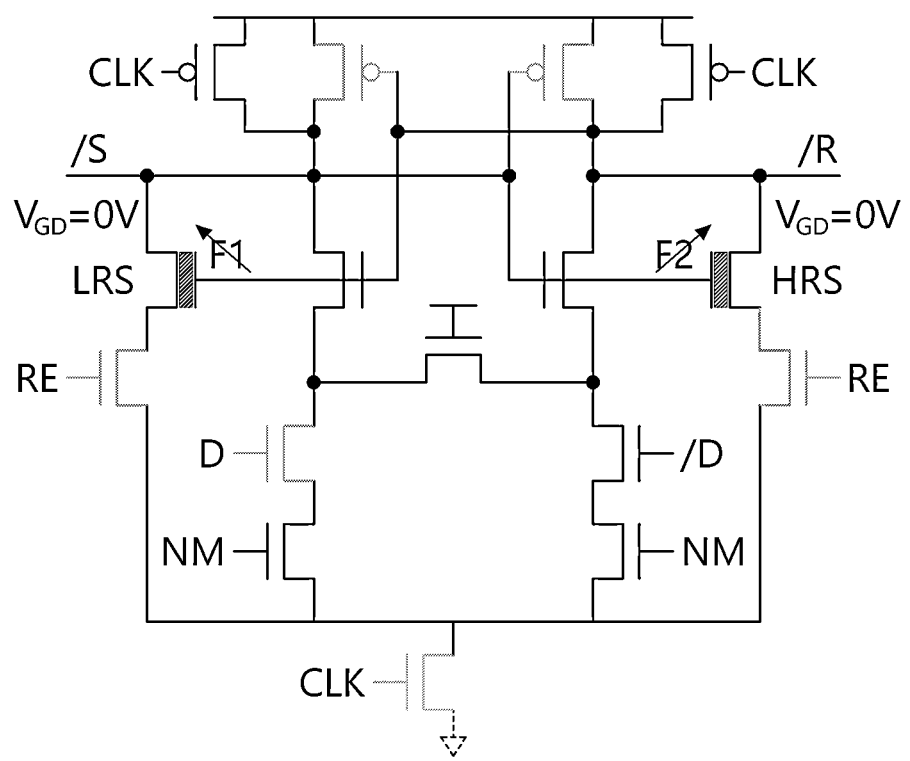
Figure 27:
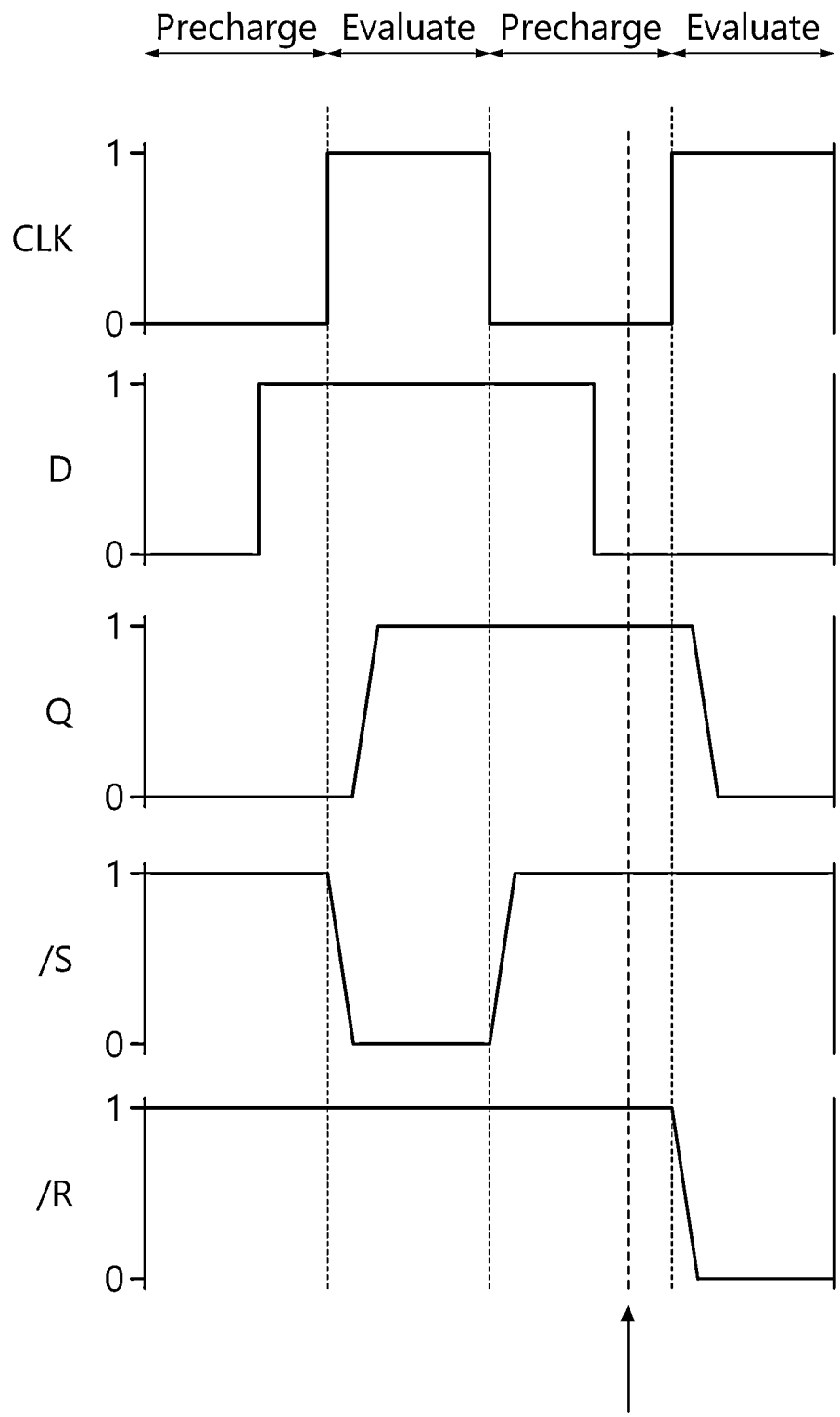

Referring to FIGS. 26 and 27, $V_{GD}=0$ V and an FeFET state is maintained. Q=1 and /Q=0 are latched.

Figure 28:
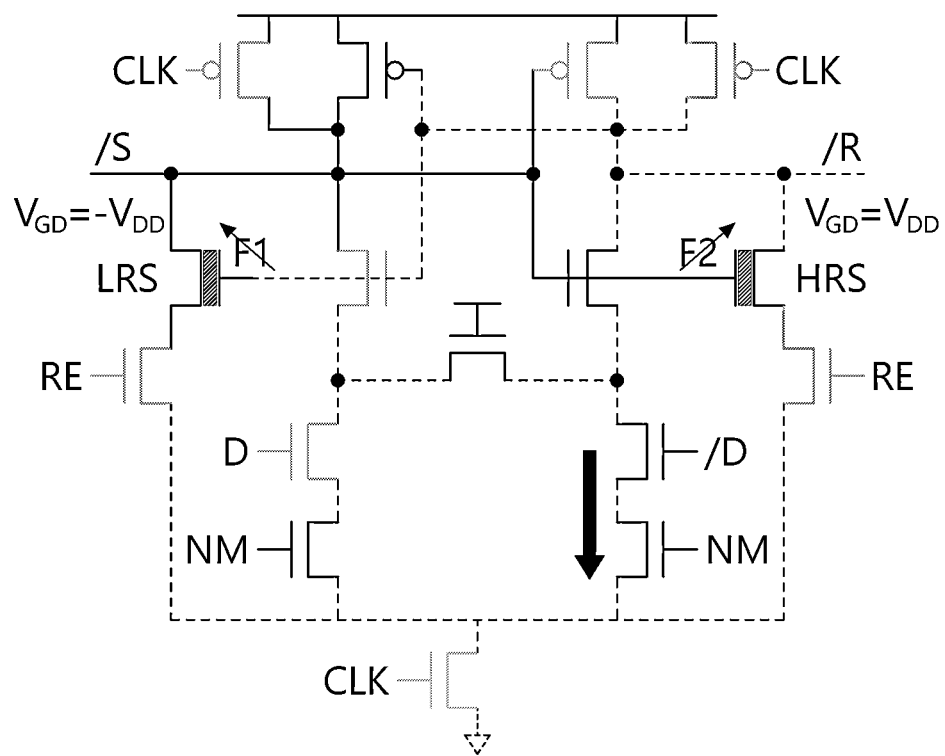
Figure 29:
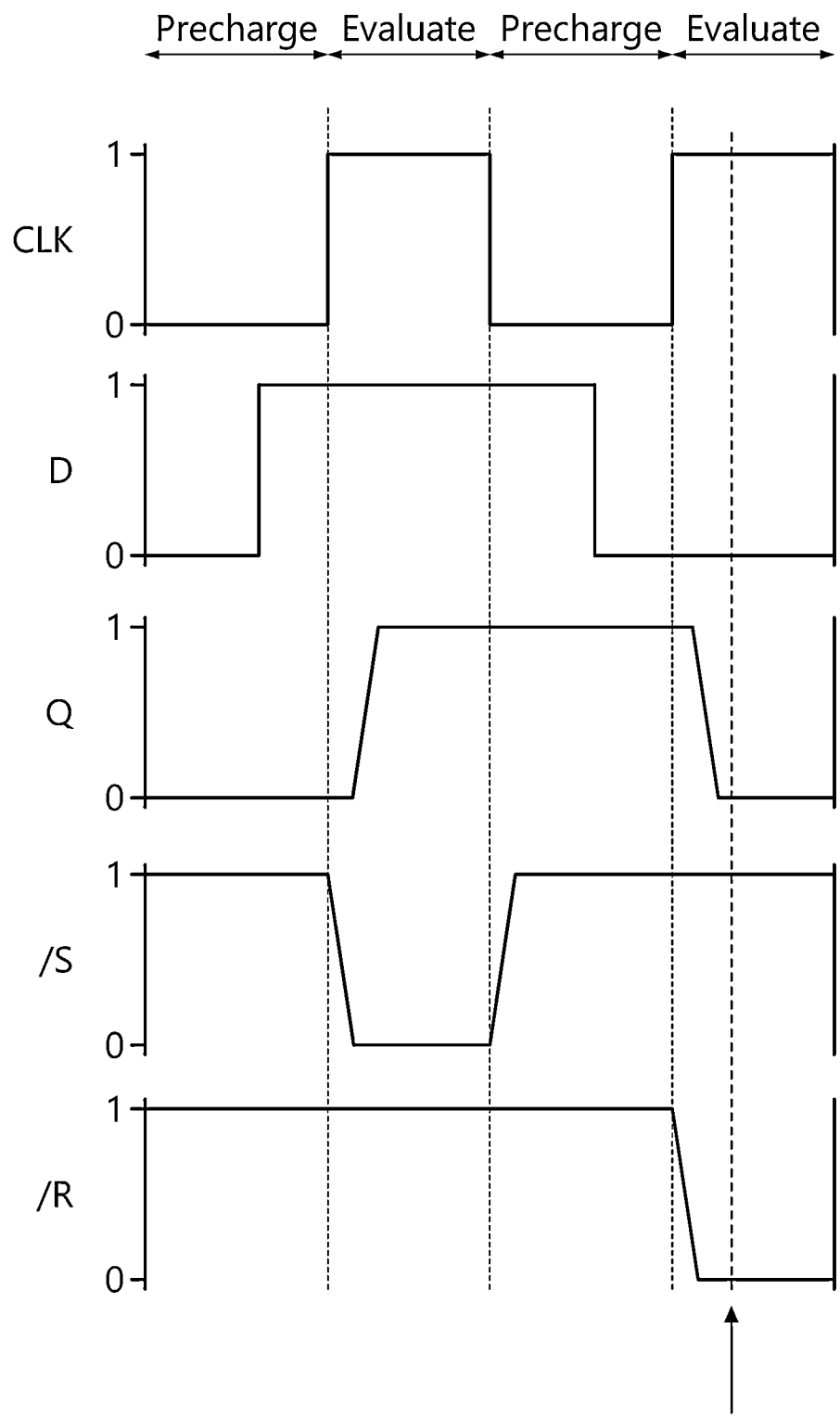

Referring to FIGS. 28 and 29, D is changed to 1 and /S is discharged to 0. Q is transited to 1 and /Q is transited to 0.

Figure 30:
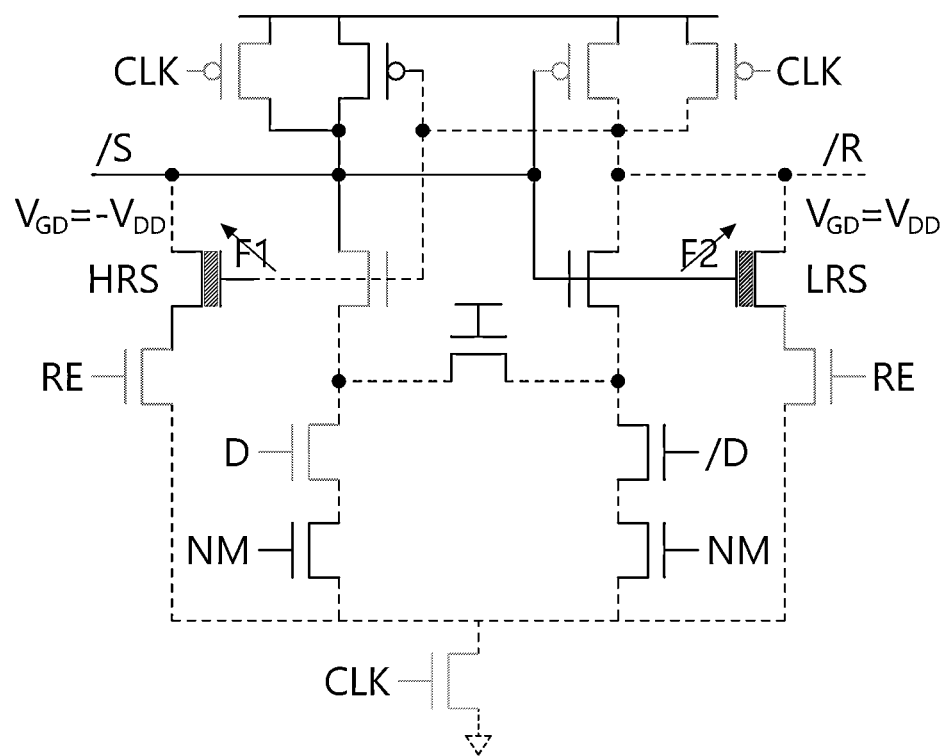
Figure 31:
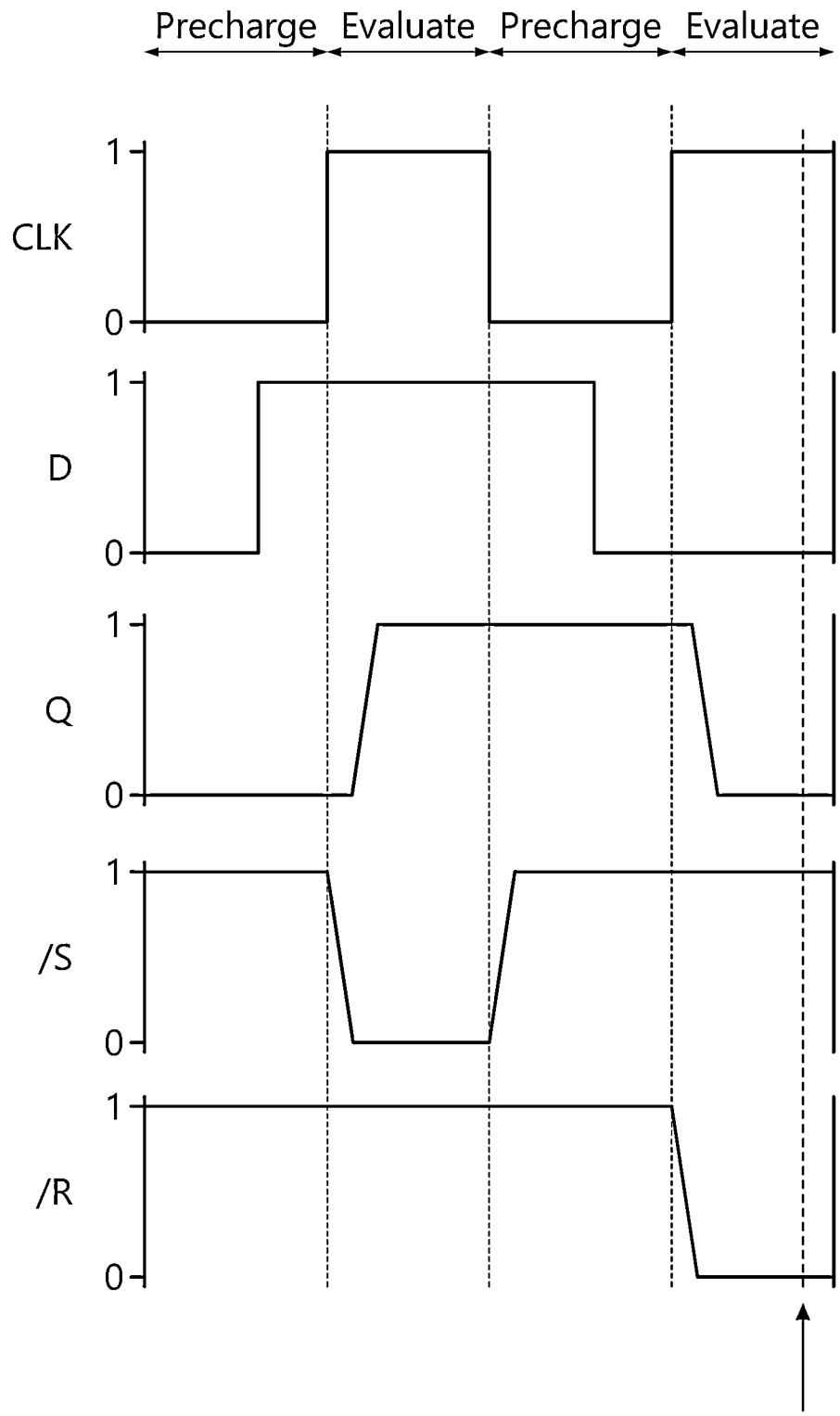

Referring to FIGS. 30 and 31, the FeFET state is automatically changed according to $V_{GD}$ (in the existing STT-MTJ and ReRAM, a separate backup mode is present).

When Q is 0 and /Q is 1, F1 is changed to HRS ($V_{GD}=-V_{DD}$), and F2 is changed to LRS ($V_{GD}=V_{DD}$).

An operation in a restore mode will be described.

Figure 32:
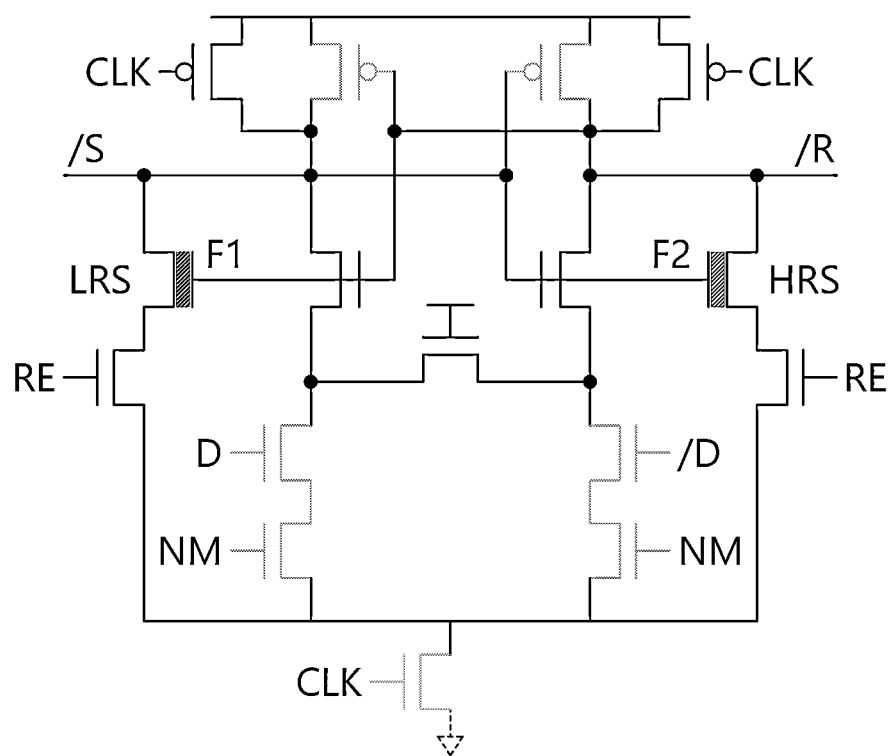
Figure 33:
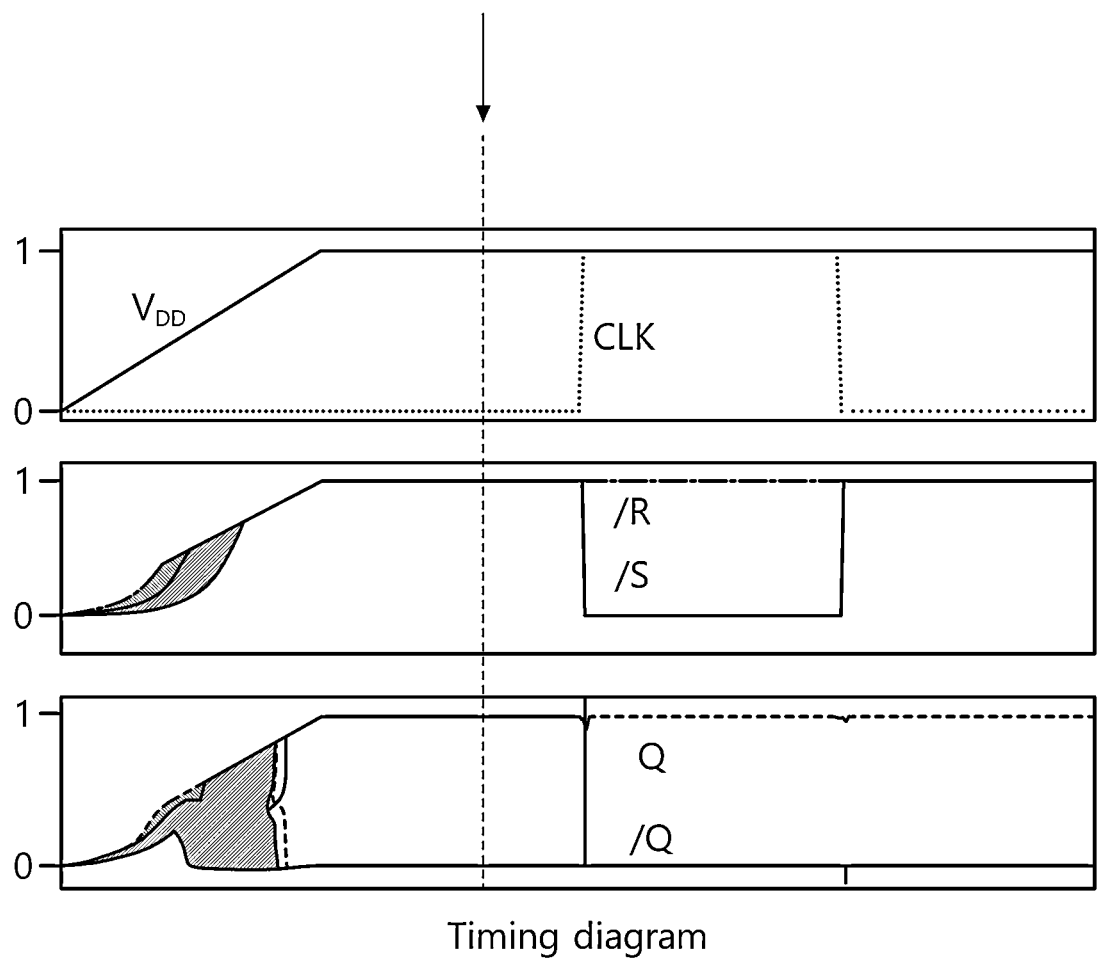

Referring to FIGS. 32 and 33, /S and /R are precharged.

Figure 34:
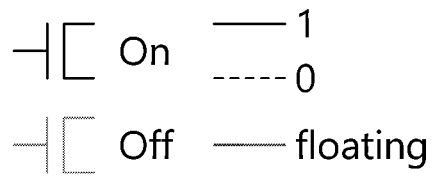
Figure 34:
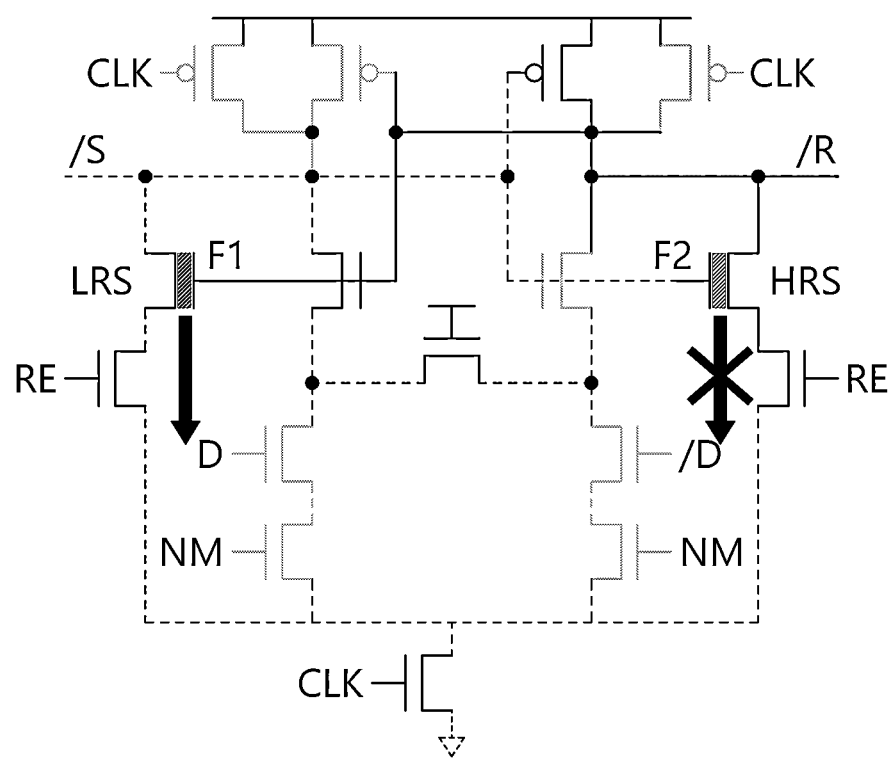
Figure 35:
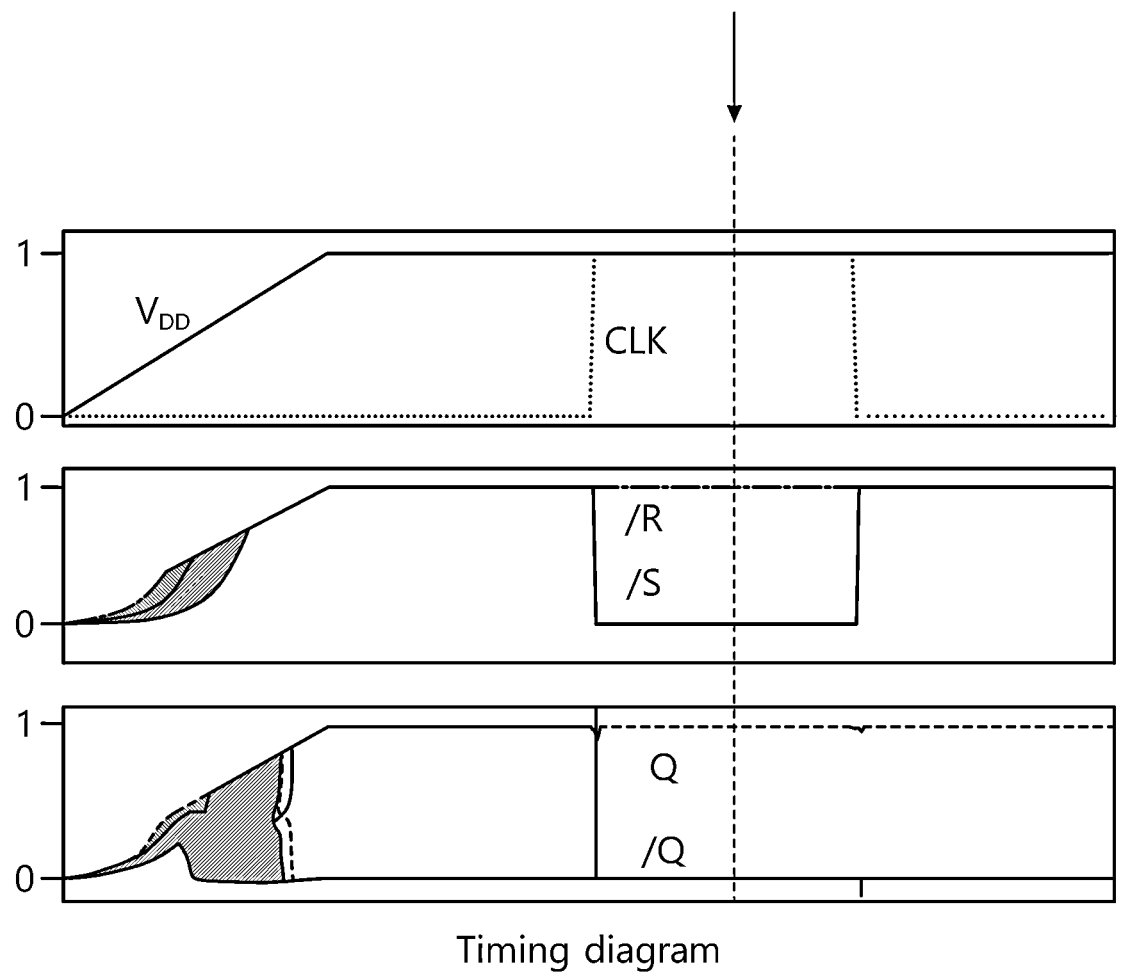

Referring to FIGS. 34 and 35, a node to which LRS FeFET is connected is discharged. /S=0, /R=1 and Q is restored to 1 and /Q is restored to 0.

Figure 36:
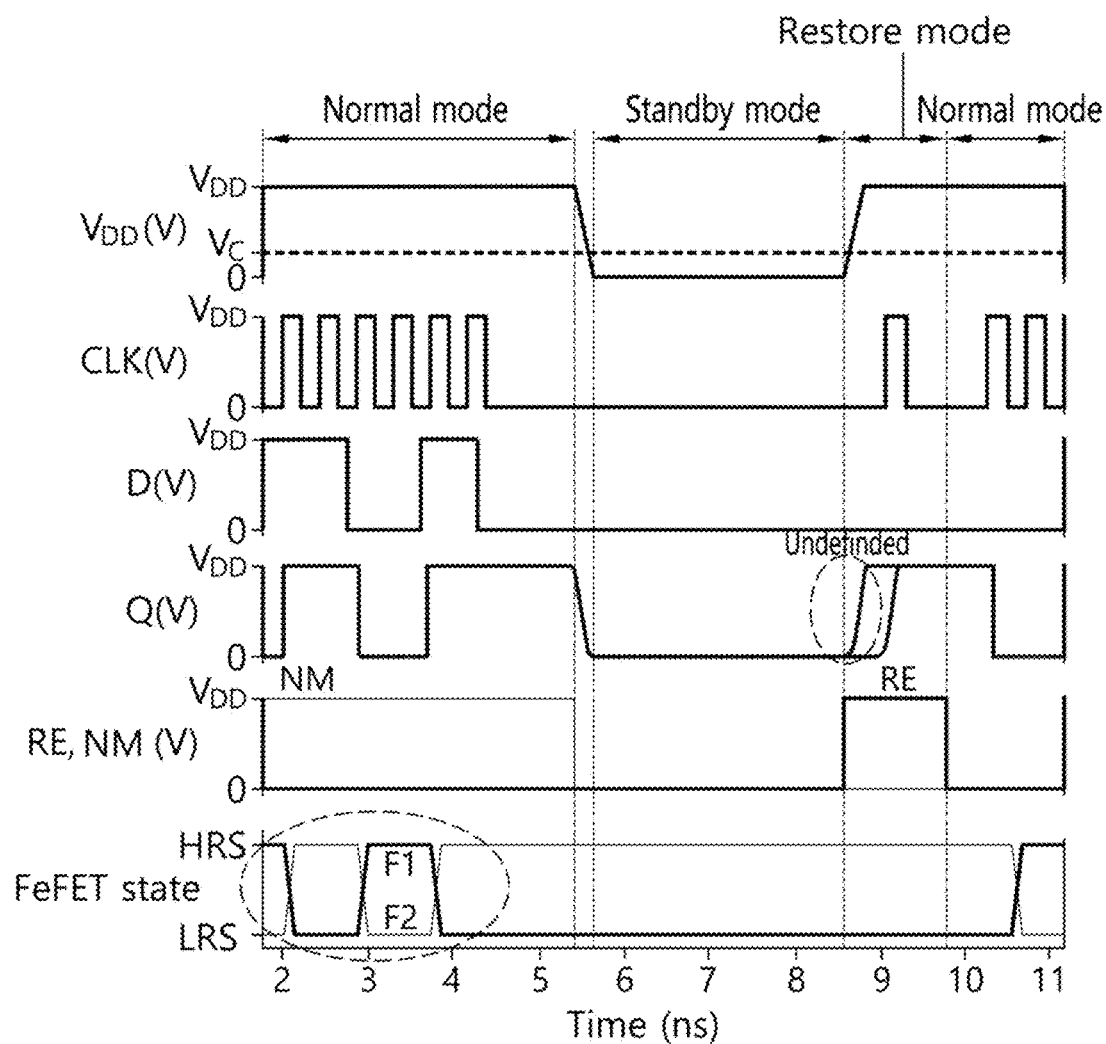

FIG. 36 illustrates a signal over the time in an entire operation mode of the first type of nonvolatile flip-flop.

Data is stored while changing states of two FeFETs, F1, and F2 according to Q (data to be stored in the flip-flop). In the restore mode, $V_{DD}$ rises so that a Q value is randomly restored to 0 or $V_{DD}$ (metastability), but data according to the state of the FeFET merged to the SA by means of one CLK cycle may be restored.

Figure 37:
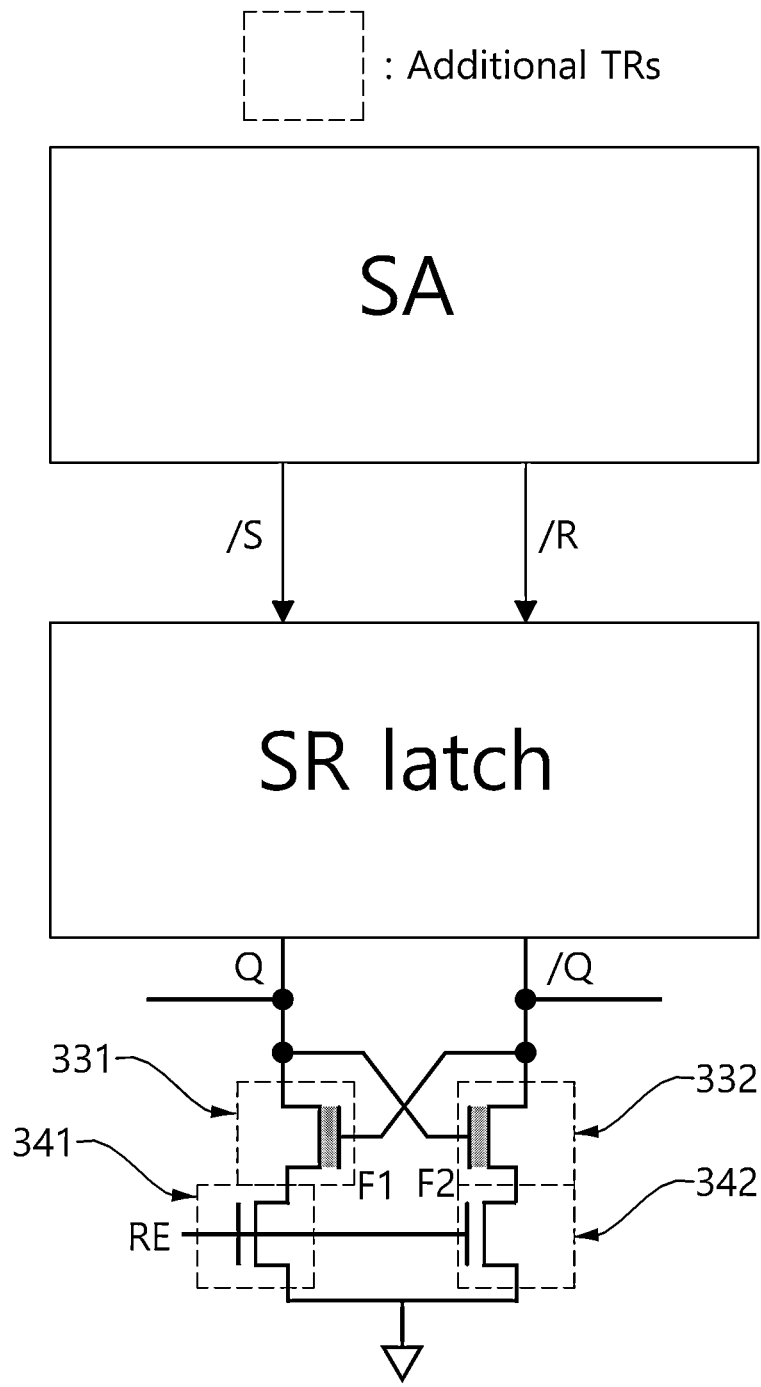
FIG. 37 is a view illustrating a second type of nonvolatile flip-flop according to another exemplary embodiment of the present disclosure.

FIG. 37 is a view illustrating a second type of nonvolatile flip-flop according to another exemplary embodiment of the present disclosure.

The second type is a latch-merged structure in which two FeFETs are added to the latch stage. The additional transistors and elements are two transistors and two FeFETs and occupy a small area. The control signal is RE (restore). A separate backup mode is not necessary and the state is changed by means of $V_{GD}$ of the FeFET. In the restore mode, simultaneously with the rising of the $V_{DD}$, the data is restored so that a small reading power and time are consumed.

The nonvolatile storage element is connected to the latch.

The nonvolatile storage element may include a second type of a first ferroelectric transistor 331 and a second type of second ferroelectric transistor 332 connected to a node through which a data output signal is output and a node through which a data bar output signal is output.

A first terminal of the second type of first ferroelectric transistor 331 is connected to a node through which the data output signal is output and a control terminal of the second type of first ferroelectric transistor 331 is connected to a node through which the data bar output signal is output.

A first terminal of the second type of second ferroelectric transistor 332 is connected to a node through which the data bar output signal is output and a control terminal of the second type of second ferroelectric transistor 332 is connected to a node through which the data output signal is output.

The nonvolatile storage element includes a second type of first additional transistor 341 which is connected to the second type of first ferroelectric transistor 331 and is controlled by a restore signal and a second type of second additional transistor 342 which is connected to the second type of second ferroelectric transistor 332 and is controlled by a restore signal. In the restore mode which is activated by the restore signal, a rising time of a driving voltage is consumed.

An operation of a normal mode (+backup mode) will be described.

Figure 38:
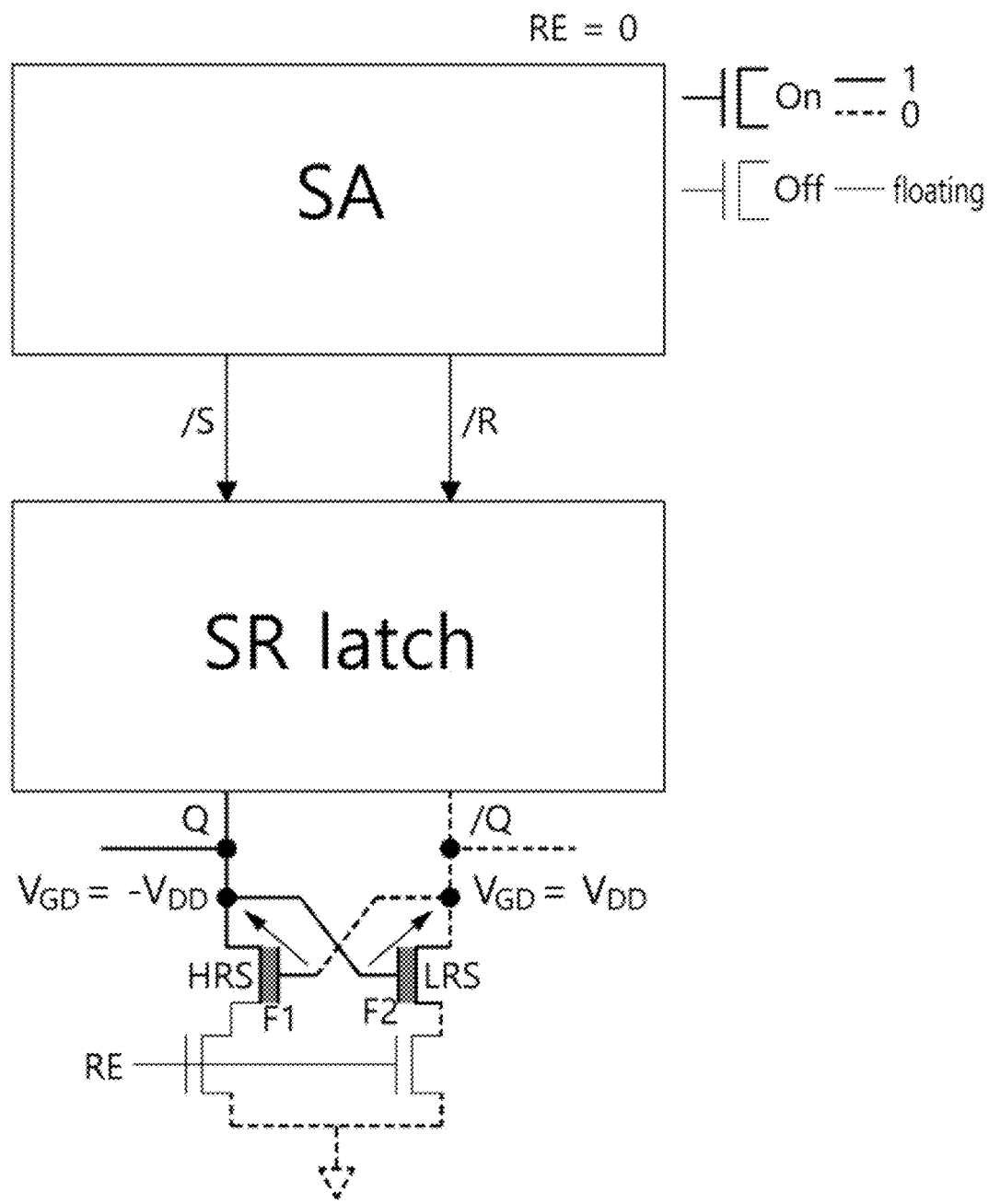
FIGS. 38, 40, and 42 are exemplary circuit diagrams of an operation of a second type of nonvolatile flip-flop according to another exemplary embodiment of the present disclosure.
Figure 39:
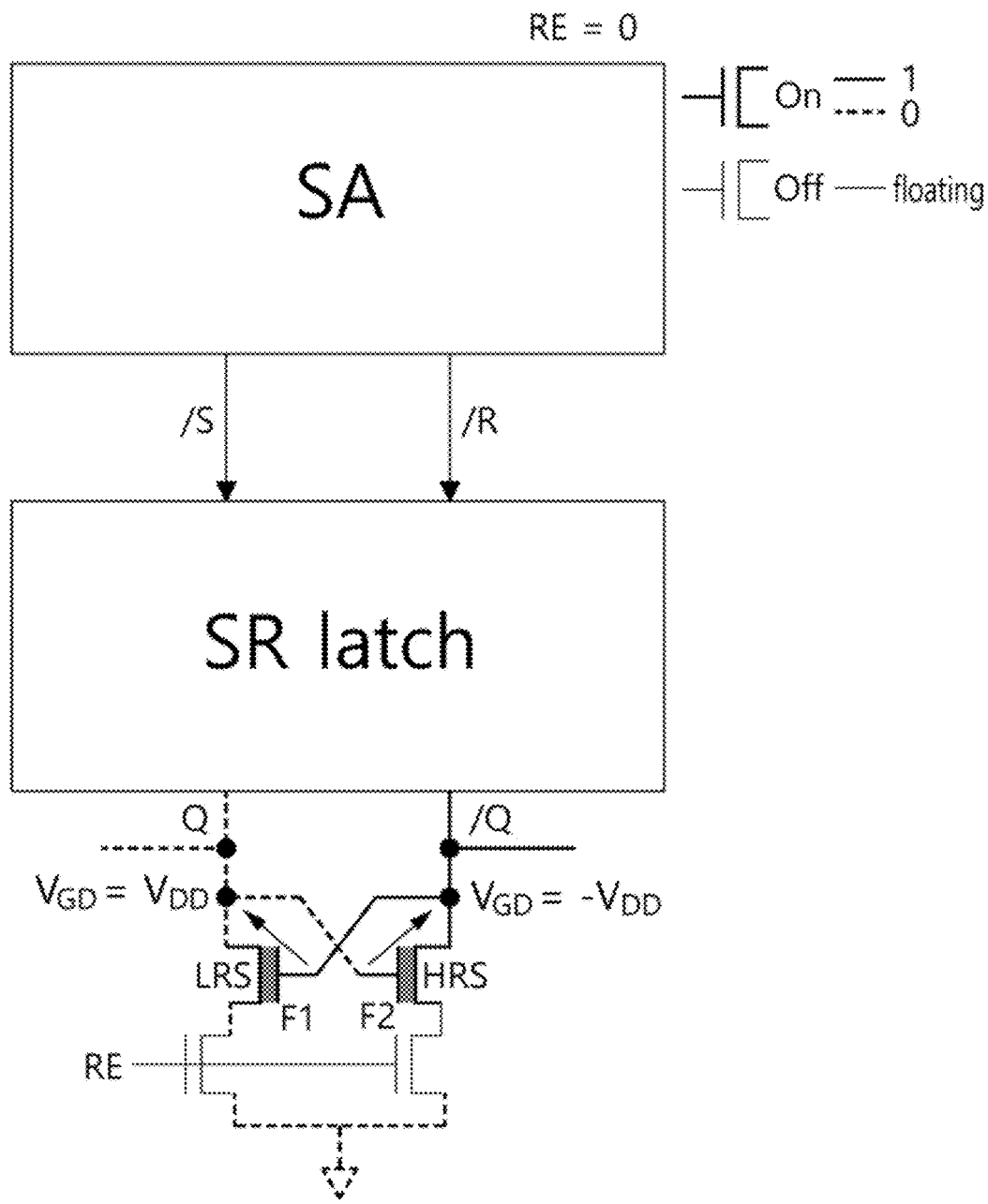
FIGS. 39, 41, 43, and 44 are exemplary timing charts of an operation of a second type of nonvolatile flip-flop according to another exemplary embodiment of the present disclosure.

Referring to FIGS. 38 and 39, the FeFET state is automatically changed according to values of Q and /Q. When Q is 1 and /Q is 0, F1 is changed to HRS ($V_{GD}=-V_{DD}$), and F2 is changed to LRS ($V_{GD}=V_{DD}$). When Q is 0 and /Q is 1, F1 is changed to LRS ($V_{GD}=V_{DD}$), and F2 is changed to HRS ($V_{GD}=-V_{DD}$).

An operation in a restore mode will be described.

Figure 40:
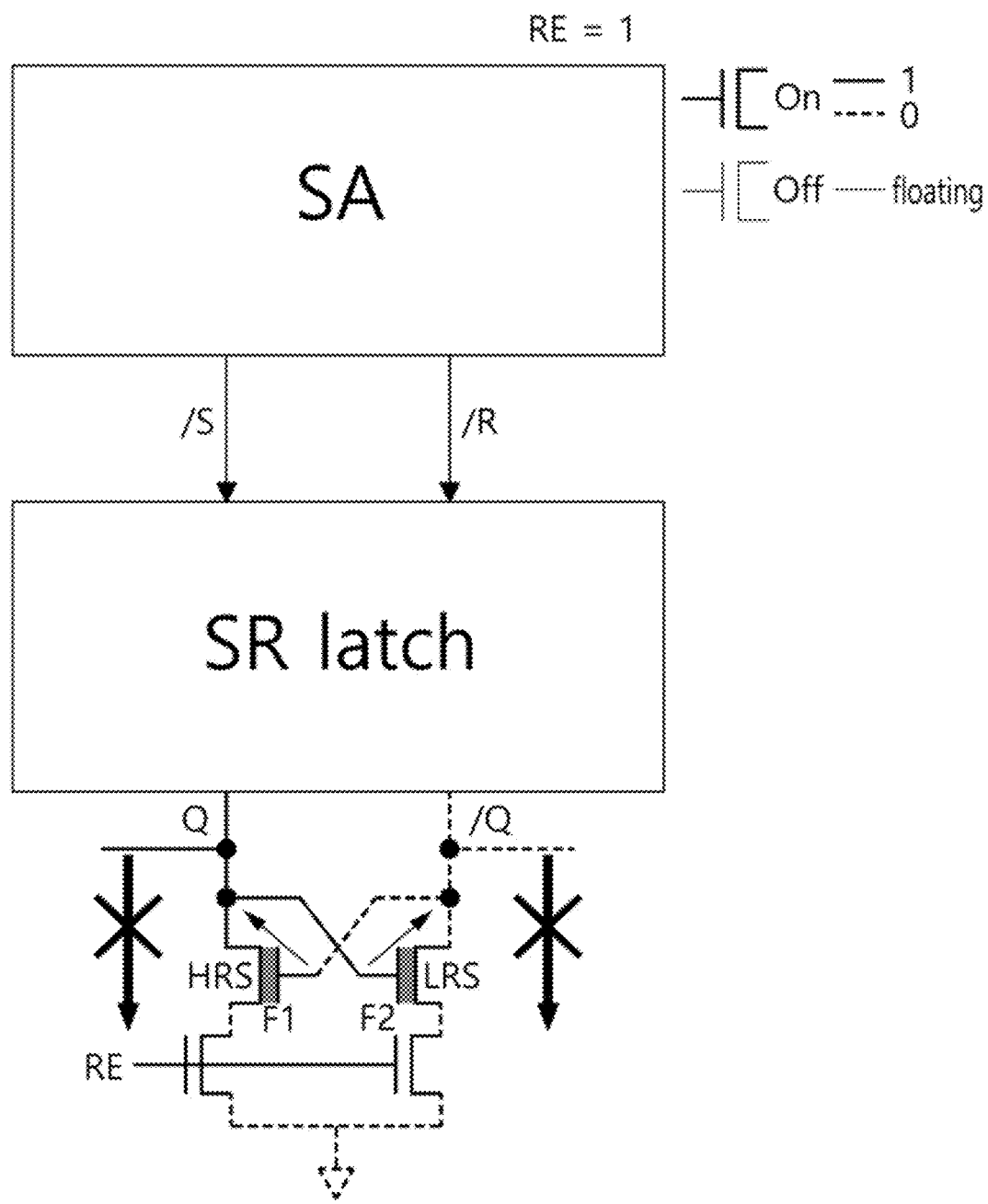
Figure 41:
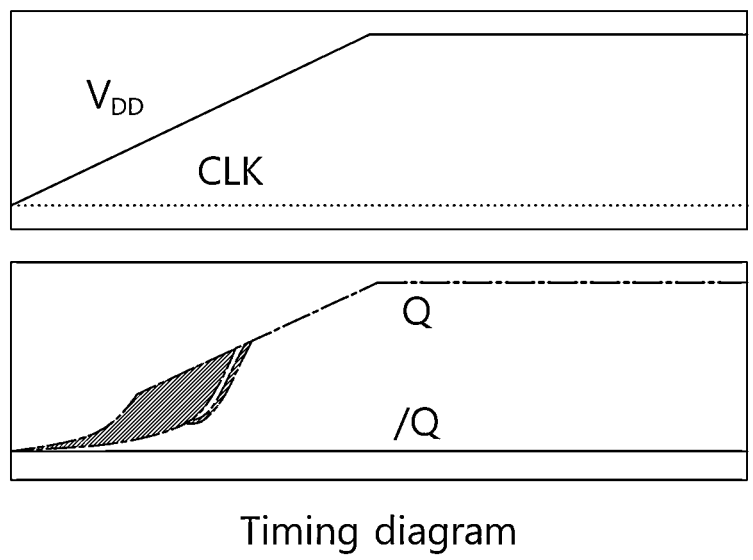

Referring to FIGS. 40 and 41, as $V_{DD}$ rises, the data is restored. A node to which LRS FeFET is connected is fixed to 0 V. Q is restored to 1 /Q is restored to 0.

Figure 42:
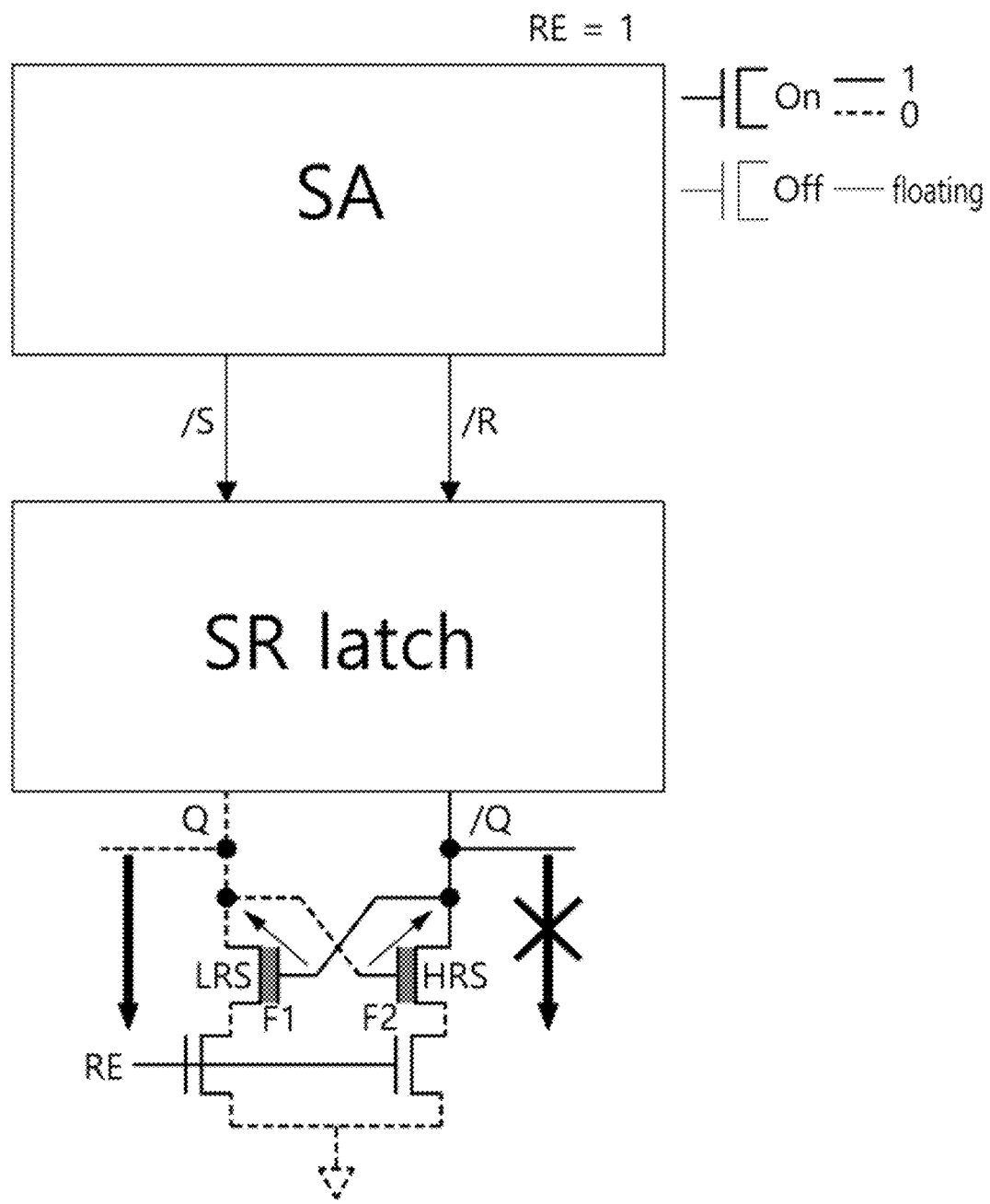
Figure 43:
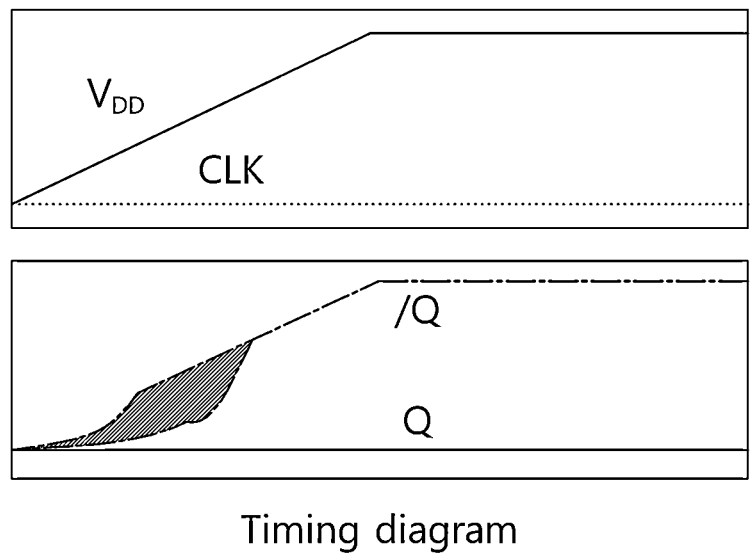

Referring to FIGS. 42 and 43, as $V_{DD}$ rises, the data is restored. A node to which LRS FeFET is connected is fixed to 0 V. Q is restored to 0 and /Q is restored to 1.

Figure 44:
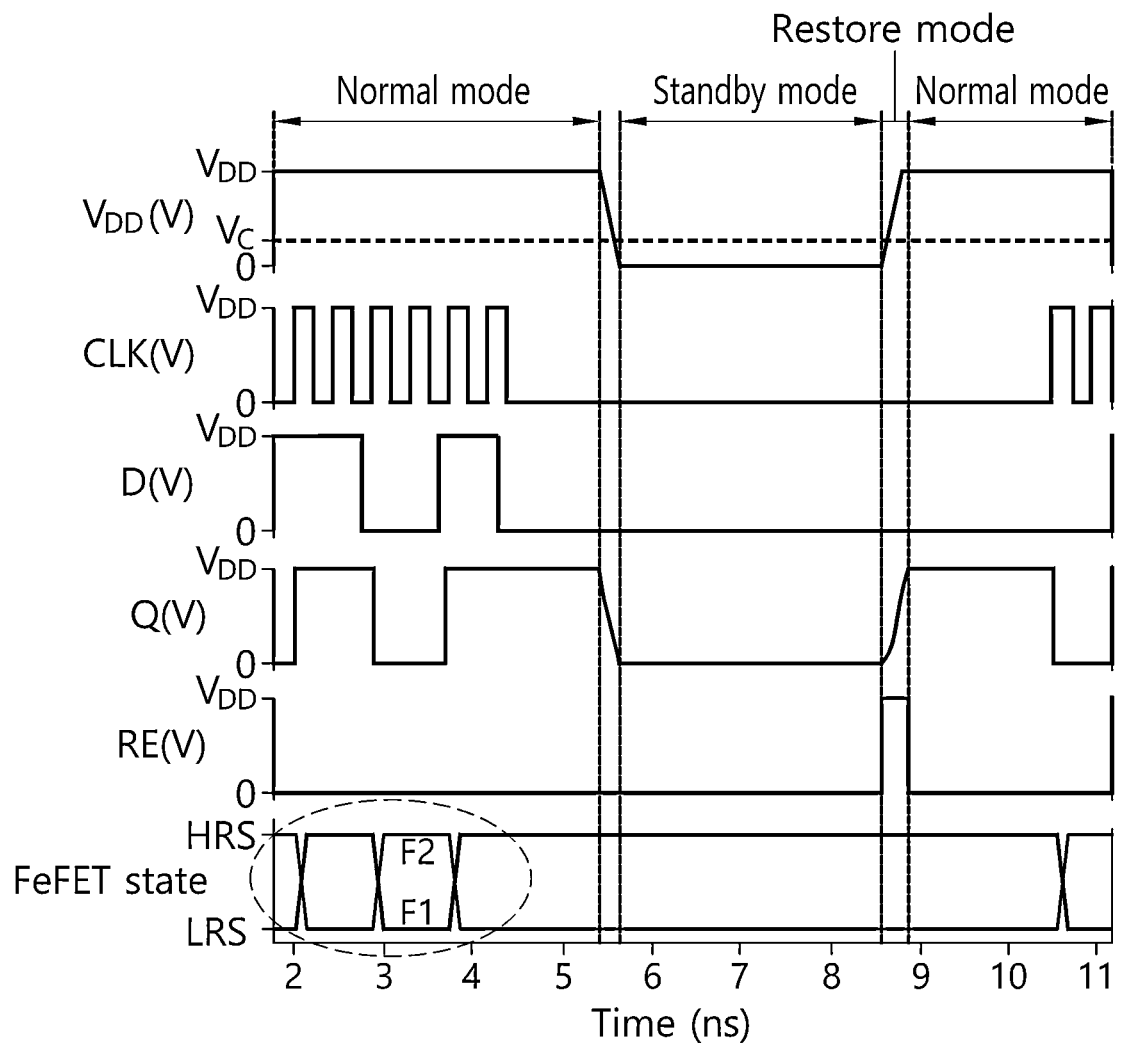

FIG. 44 illustrates a signal over the time in an entire operation mode of the second type of nonvolatile flip-flop.

Data is stored while changing states of two FeFETs, F1, and F2 according to Q (data to be stored in the flip-flop). As $V_{DD}$ rises in the restore mode, a Q value according to the state of FeFET merged to the latch may be restored.

$V_{DD}$ is larger than $V_C$ ($V_{DD} > V_C$) and the state of the FeFET is changed according to the Q value at every CLK cycle to store the data so that a separate backup mode is not necessary. The energy-harvesting device which has an unstable power source frequently loses data so that data is stored at every CLK cycle to obtain a gain.

FIG. 45 is a table in which exemplary embodiments of the present disclosure are compared and summarized.

A plurality of components included in an electronic device to which the nonvolatile flip-flop is applied is combined to each other to be implemented by at least one module. The components are connected to a communication path which connects a software module or a hardware module in the apparatus to organically operate between the components. The components communicate with each other using one or more communication buses or signal lines.

The electronic device to which the nonvolatile flip-flop is applied may be implemented in a logic circuit by hardware, firm ware, software, or a combination thereof or may be implemented using a general purpose or special purpose computer. The device may be implemented using hardwired device, field programmable gate array (FPGA) or application specific integrated circuit (ASIC). Further, the device may be implemented by a system on chip (SoC) including one or more processors and a controller.

The electronic device to which the nonvolatile flip-flop is applied may be mounted in a computing device provided with a hardware element as a software, a hardware, or a combination thereof. The computing device may refer to various devices including all or some of a communication device for communicating with various devices and wired/wireless communication networks such as a communication modem, a memory which stores data for executing programs, and a microprocessor which executes programs to perform operations and commands.

The operation according to the exemplary embodiment of the present disclosure may be implemented as a program instruction which may be executed by various computers to be recorded in a computer readable medium. The computer readable medium indicates an arbitrary medium which participates to provide a command to a processor for execution. The computer readable medium may include solely a program command, a data file, and a data structure or a combination thereof. For example, the computer readable medium may include a magnetic medium, an optical recording medium, and a memory. The computer program may be distributed on a networked computer system so that the computer readable code may be stored and executed in a distributed manner. Functional programs, codes, and code segments for implementing the present embodiment may be easily inferred by programmers in the art to which this embodiment belongs.

The present embodiments are provided to explain the technical spirit of the present embodiment and the scope of the technical spirit of the present embodiment is not limited by these embodiments. The protection scope of the present embodiments should be interpreted based on the following appended claims and it should be appreciated that all technical spirits included within a range equivalent thereto are included in the protection scope of the present embodiments.

What is claimed is:

1. A nonvolatile flip-flop, comprising:
    a sense amplifier which receives a data input signal and a data bar input signal and outputs a set bar signal and a reset bar signal;
    a latch which is connected to the sense amplifier and receives the set bar signal and the reset bar signal and outputs a data output signal and a data bar output signal; and
    a nonvolatile storage element which is connected to the sense amplifier or the latch and is applied with a ferroelectric transistor.

2. The nonvolatile flip-flop according to claim 1, wherein the nonvolatile flip-flop uses a state change of the ferroelectric transistor to operate in a normal mode, a standby mode, or a restore mode without having a separate backup mode.

3. The nonvolatile flip-flop according to claim 2, wherein the nonvolatile storage element includes a plurality of ferroelectric transistors and the plurality of ferroelectric transistors has opposite states and the state represents a low resistance state (LRS) or a high resistance state (HRS).

4. The nonvolatile flip-flop according to claim 3, wherein the nonvolatile storage element is connected to the sense amplifier and the nonvolatile storage element includes a first type of first ferroelectric transistor and a first type of second ferroelectric transistor connected to a node through which a set bar signal is output and a node through which a reset bar is output.

5. The nonvolatile flip-flop according to claim 4, wherein a first terminal of the first type of first ferroelectric transistor is connected to a node through which the set bar signal is output and a control terminal of the first type of first ferroelectric transistor is connected to a node through which the reset bar signal is output.

6. The nonvolatile flip-flop according to claim 4, wherein a first terminal of the first type of second ferroelectric transistor is connected to a node through which the reset bar signal is output and a control terminal of the first type of second ferroelectric transistor is connected to a node through which the set bar signal is output.

7. The nonvolatile flip-flop according to claim 4, wherein the nonvolatile storage element includes:
   a first type of first additional transistor which is connected to the first type of first ferroelectric transistor and is controlled by a restore signal; and
   a first type of second additional transistor which is connected to the first type of second ferroelectric transistor and is controlled by the restore signal.

8. The nonvolatile flip-flop according to claim 7, wherein the nonvolatile storage element includes:
   a first type of third additional transistor which is connected to a transistor controlled by the data input signal and is controlled by a normal mode signal; and
   a first type of fourth additional transistor which is connected to a transistor controlled by the data bar input signal and is controlled by the normal mode signal.

9. The nonvolatile flip-flop according to claim 8, wherein a first terminal of the first type of first additional transistor is connected to the first type of first ferroelectric transistor and a second terminal of the first type of first additional transistor is connected to the first type of third additional transistor.

10. The nonvolatile flip-flop according to claim 8, wherein a first terminal of the first type of second additional transistor is connected to the first type of second ferroelectric transistor and a second terminal of the first type of second additional transistor is connected to the first type of fourth additional transistor.

11. The nonvolatile flip-flop according to claim 8, wherein a first terminal of the first type of third additional transistor is connected to a transistor controlled by the data input signal, a first terminal of the first type of fourth additional transistor is connected to a transistor controlled by the data bar input signal, and a second terminal of the first type of third additional transistor and a second terminal of the first type of fourth additional transistor are connected to a transistor controlled by a clock signal.

12. The nonvolatile flip-flop according to claim 7, wherein in a restore mode which is activated by the restore signal, a rising time of a driving voltage and one clock cycle are consumed.

13. The nonvolatile flip-flop of claim 3, wherein the nonvolatile storage element is connected to the latch and
   the nonvolatile storage element includes:
   a second type of first ferroelectric transistor and a second type of second ferroelectric transistor connected to a node through which the data output signal is output and a node through which the data bar output signal is output.

14. The nonvolatile flip-mode according to claim 13, wherein a first terminal of the second type of first ferroelectric transistor is connected to a node through which the data output signal is output and a control terminal of the second type of first ferroelectric transistor is connected to a node through which the data bar output signal is output.

15. The nonvolatile flip-mode according to claim 13, wherein a first terminal of the second type of second ferroelectric transistor is connected to a node through which the data bar output signal is output and a control terminal of the second type of second ferroelectric transistor is connected to a node through which the data output signal is output.

16. The nonvolatile flip-mode according to claim 13, wherein the nonvolatile storage element includes:
   a second type of first additional transistor which is connected to the second type of first ferroelectric transistor and is controlled by a restore signal; and
   a second type of second additional transistor which is connected to the second type of second ferroelectric transistor and is controlled by the restore signal.

17. The nonvolatile flip-flop according to claim 16, wherein in a restore mode which is activated by the restore signal, a rising time of a driving voltage is consumed.

* * * * *